(12) United States Patent
Elce et al.

(10) Patent No.: US 10,054,854 B2
(45) Date of Patent: Aug. 21, 2018

(54) FLUORINE FREE PHOTOPATTERNABLE PHENOL FUNCTIONAL GROUP CONTAINING POLYMER COMPOSITIONS

(71) Applicant: PROMERUS, LLC, Brecksville, OH (US)

(72) Inventors: Edmund Elce, Brecksville, OH (US); Royce Groff, Brecksville, OH (US)

(73) Assignee: PROMERUS, LLC, Brecksville, OH (US)

( * ) Notice: Subject to any disclaimer, the term of this patent is extended or adjusted under 35 U.S.C. 154(b) by 0 days.

(21) Appl. No.: 15/276,997

(22) Filed: Sep. 27, 2016

(65) Prior Publication Data

US 2017/0097566 A1 Apr. 6, 2017

Related U.S. Application Data

(60) Provisional application No. 62/235,919, filed on Oct. 1, 2015.

(51) Int. Cl.

| | |
|---|---|
| *G03F 7/039* | (2006.01) |
| *C08F 32/08* | (2006.01) |
| *G03F 7/40* | (2006.01) |
| *G03F 7/32* | (2006.01) |
| *G03F 7/022* | (2006.01) |
| *G03F 7/16* | (2006.01) |
| *G03F 7/20* | (2006.01) |

(52) U.S. Cl.
CPC ............ *G03F 7/0395* (2013.01); *C08F 32/08* (2013.01); *G03F 7/022* (2013.01); *G03F 7/162* (2013.01); *G03F 7/2002* (2013.01); *G03F 7/327* (2013.01); *G03F 7/40* (2013.01); *C08F 2500/26* (2013.01); *C08F 2800/20* (2013.01)

(58) Field of Classification Search
CPC ...... G03F 7/0395; G03F 7/0397; C08F 32/08; C08F 32/00
See application file for complete search history.

(56) References Cited

U.S. PATENT DOCUMENTS

| 2006/0008734 A1 | 1/2006 | Amoroso et al. |
| 2012/0129101 A1 | 5/2012 | Onishi et al. |

FOREIGN PATENT DOCUMENTS

WO WO2011/002516 A2 1/2011

*Primary Examiner* — Cynthia Hamilton
(74) *Attorney, Agent, or Firm* — Balaram Gupta

(57) ABSTRACT

Various polycycloolefinic polymers containing phenolic pendent groups and compositions thereof useful for forming self-imageable films encompassing such polymers are disclosed. Such polymers encompass norbornene-type repeating units containing phenolic pendent groups which contain very low levels of fluorine containing monomers. The films formed from such polymer compositions provide self imageable, low-k, thermally stable layers for use in microelectronic and optoelectronic devices.

11 Claims, 4 Drawing Sheets

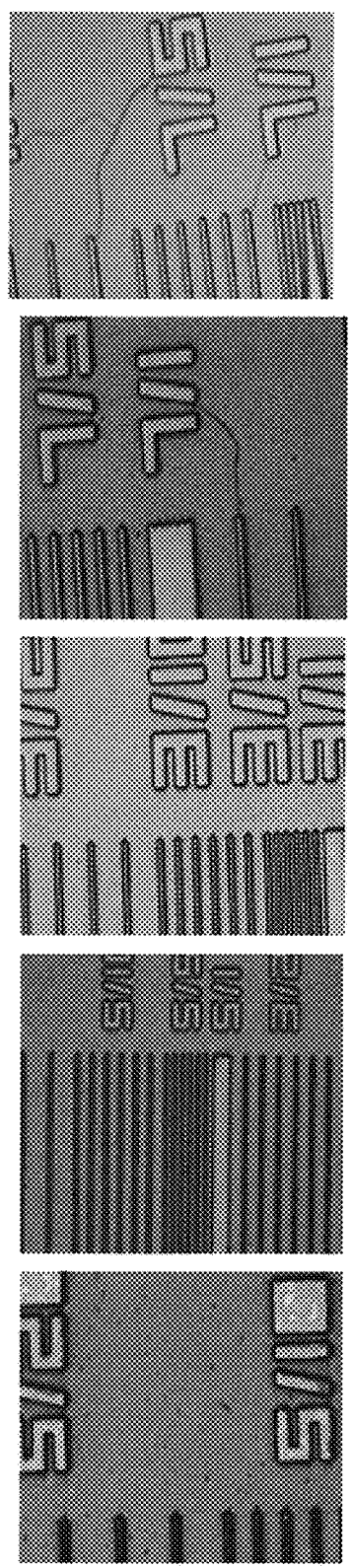

FLUORINE FREE PHOTOPATTERNABLE PHENOL FUNCTIONAL GROUP CONTAINING POLYMER COMPOSITIONS

CROSS REFERENCE TO RELATED APPLICATIONS

This application claims the benefit of U.S. Provisional Application No. 62/235,919, filed Oct. 1, 2015, which is incorporated herein by reference in its entirety.

TECHNICAL FIELD

The present invention relates to phenol functional group containing cycloolefinic monomers having utility as permanent dielectric materials. More specifically, the present invention relates to a series of polymeric compositions derived from phenol functional group containing norbornene-type cycloolefinic monomers, which are substantially free of fluorine. This invention also relates to methods of making these polymers and applications thereof. In particular, the polymers of this invention are found to be useful in various electronic material applications as permanent dielectrics among various other uses.

BACKGROUND

As the microelectronic devices are fabricated in smaller geometries there is an increasing demand for advanced materials that meet the stringent requirements of confined smaller geometries. In particular, sub-micron device geometries have become common place in the fabrication of a variety of microelectronics packages for memory and logic integrated circuits (ICs), liquid crystal displays (LCDs), organic light emitting diodes (OLEDs) and other radio frequency (Rf) and microwave devices. For example, devices such as radio frequency integrated circuits (RFICs), micro-machine integrated circuits (MMICs), switches, couplers, phase shifters, surface acoustic wave (SAW) filters and SAW duplexers, have recently been fabricated with submicron dimensions.

With such smaller geometries comes a requirement for dielectric materials with low dielectric constants to reduce or eliminate any cross-talk between adjacent signal lines or between a signal line and a device feature (e.g. a pixel electrode) due to capacitive coupling. Although many low dielectric (low-K) materials are available for microelectronic devices, for optoelectronic devices such materials must also be broadly transparent in the visible light spectrum, not require high temperature processing (greater than 300° C.) that would be incompatible with other elements of such an optoelectronic device, and be both low-cost and feasible for large scale optoelectronic device fabrication.

Thus, it would be desirable to have a material capable of forming a self-imageable layer to avoid the need for depositing a separate imaging layer. Such material should also be easy to apply to a substrate, have a low dielectric constant (3.9 or less) and thermal stability to temperatures in excess of 250° C. Of course, it is also desirable to have such materials available at a lower cost and feature such properties as positive or negative tone photoimaging capability, aqueous base developing capability, high transparency after heat stress and low weight loss at curing temperatures. It has been reported that acrylic polymers, which are inexpensive, offer good photoimaging properties and are aqueous base developable, see for example, Japanese Patent Application Laid-open No. Hei 5-165214 and the radiation-sensitive resin composition comprising an alicyclic olefin resin disclosed in Japanese Patent Application Laid-open No. 2003-162054. Similarly, polyimides have been reported to provide good thermal stability. However, these materials have certain deficiencies and thus making them not so suitable for the applications contemplated herein. For instance, acrylics are not suitable for applications requiring high thermal stability (i.e., temperatures higher than 200° C.), and many of the polyimides in general are not suitable for either positive tone or negative tone formulations requiring aqueous base developability and generally do not exhibit desirable transparency, thus making them unsuitable in certain optoelectronic applications. Although some polyimides and polybenzoxazoles have low dielectric constants but still may not have low enough permittivity to be effective in highly integrated and/or miniaturized devices having increased wiring density and high signal speed. Furthermore, both polyimides and polybenzoxazoles require cure temperatures in excess of 300° C., thus rendering them unsuitable for many applications. One such known polyimide material is the positive tone photosensitive resin comprising a polyimide precursor and a diazoquinone-type compound disclosed in Japanese Patent No. 3,262,108.

Recently, it has been reported that certain polymers containing norbornene-type repeat units having pendent phenol groups are useful in certain microelectronic applications featuring self-image forming layer capability, when image-wise-exposed to actinic radiation, see U.S. Pat. Nos. 8,748, 074 and 8,753,790, pertinent portions of which are incorporated herein. Generally, the polymers reported therein incorporate perfluoroalkyl substituted monomers in order to improve the dissolution characteristics of such compositions after image-wise exposed to suitable radiation and developed in an aqueous media. However, there are concerns in the electronic applications that presence of fluorine restricts use of such polymers containing the fluorinated monomers. For example, there is a concern of metal corrosion due to the presence of a fluoride in the dielectric polymer employed in the electronic device fabrication. In addition, the fluorinated monomers, such as for example, 2-(bicyclo[2.2.1]hept-5-en-2-ylmethyl)-1,1,1,3,3,3-hexafluoropropan-2-ol (HFANB), are expensive rendering polymers containing such monomers less attractive for such applications.

Accordingly, there is a need for cost effective permanent dielectric materials having not only self photopatternable properties but also retaining of film thickness from the unexposed regions of a positive tone formulation (i.e., low dark field loss), low thermal reflow after cure, improved stability to various chemicals and process conditions involved in the downstream process fabrication steps, such as, for example, in a device containing a redistribution layer (RDL), and/or solvent stripper operations, among others.

Thus it is an object of this invention to provide organic polymer materials having aforementioned properties for a variety of electronic and/or optoelectronic device fabrication applications.

BRIEF DESCRIPTION OF THE DRAWINGS

Embodiments in accordance with the present invention are described below with reference to the following accompanying figures and/or images. Where drawings are provided, it will be drawings which are simplified portions of a device provided for illustrative purposes only.

FIGS. 1A to 1E show optical micrographs of a positive tone lithographic images of line and space pattern obtained from a few of the photosensitive composition embodiments of this invention.

DETAILED DESCRIPTION

Figure 2C:
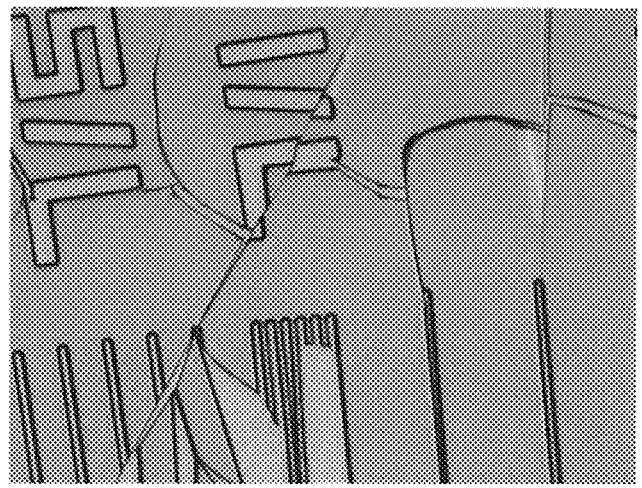
FIGS. 2B and 2C show optical micrographs of a positive tone lithographic images of line and space pattern obtained from a few of the Comparative Compositions which are compared with optical micrograph, FIG. 2A, which is obtained from a photosensitive composition embodiment of this invention.

Embodiments in accordance with the present invention are directed to various polymers, including but not limited to, polymers that encompass at least one repeating unit derived from a certain type of norbornene-type monomer containing a phenolic pendent group as described herein, as such are defined hereinafter and at least one or more norbornene type monomers distinct from each other, and to compositions encompassing such polymers. Such polymer compositions being capable of forming self-imageable films useful as layers in the manufacture of microelectronic and optoelectronic devices. That is to say that, after image-wise exposure to actinic radiation, such layers (or films) can be developed to form patterned layers (or films), where such pattern is reflective of the image through which the layers (or films) was exposed. In this manner, structures can be provided that are, or are to become, a part of such microelectronic and/or optoelectronic devices.

The terms as used herein have the following meanings:

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all sub-ranges subsumed therein. For example, a stated range of from "1 to 10" should be considered to include any and all sub-ranges between the minimum value of 1 and the maximum value of 10. Exemplary sub-ranges of the range 1 to 10 include, but are not limited to, 1 to 6.1, 3.5 to 7.8, and 5.5 to 10, etc.

As used herein, the symbol "〜〜" denotes a position at which the bonding takes place with another repeat unit or another atom or molecule or group or moiety as appropriate with the structure of the group as shown.

As used herein, "hydrocarbyl" refers to a radical of a group that contains carbon and hydrogen atoms, non-limiting examples being alkyl, cycloalkyl, aryl, aralkyl, alkaryl, and alkenyl. The term "halohydrocarbyl" refers to a hydrocarbyl group where at least one hydrogen has been replaced by a halogen. The term perhalocarbyl refers to a hydrocarbyl to group where all hydrogens have been replaced by a halogen.

As used herein, the expression "$(C_1-C_{15})$alkyl" includes methyl and ethyl groups, and straight-chained or branched propyl, butyl, pentyl, hexyl, heptyl, and various other homolog groups. Particular alkyl groups are methyl, ethyl, n-propyl, isopropyl and tert-butyl, etc. Derived expressions, such as "$(C_1-C_{15})$alkoxy", "$(C_1-C_{15})$thioalkyl" "$(C_1-C_{15})$alkoxy$(C_1-C_{15})$alkyl", "hydroxy$(C_1-C_{15})$alkyl", "$(C_1-C_{15})$alkylcarbonyl", "$(C_1-C_{15})$alkoxycarbonyl$(C_1-C_{15})$alkyl", "$(C_1-C_{15})$alkoxycarbonyl", "amino$(C_1-C_{15})$alkyl", "$(C_1-C_{15})$alkylamino", "$(C_1-C_{15})$alkylcarbamoyl$(C_1-C_{15})$alkyl", "$(C_1-C_{15})$dialkylcarbamoyl$(C_1-C_{15})$alkyl" "mono- or di-$(C_1-C_{15})$alkylamino$(C_1-C_{15})$alkyl", "amino$(C_1-C_{15})$alkylcarbonyl" "diphenyl$(C_1-C_{15})$alkyl", "phenyl$(C_1-C_{15})$alkyl", "phenylcarbonyl$(C_1-C_{15})$alkyl" and "phenoxy$(C_1-C_{15})$alkyl" are to be construed accordingly.

As used herein, the expression "cycloalkyl" includes all of the known cyclic radicals. Representative examples of "cycloalkyl" includes without any limitation cyclopropyl, cyclobutyl, cyclopentyl, cyclohexyl, cycloheptyl, cyclooctyl, and the like. Derived expressions such as "cycloalkoxy", "cycloalkylalkyl", "cycloalkylaryl", "cycloalkylcarbonyl" are to be construed accordingly.

As used herein, the expression "$(C_2-C_6)$alkenyl" includes ethenyl and straight-chained or branched propenyl, butenyl, pentenyl and hexenyl groups. Similarly, the expression "$(C_2-C_6)$alkynyl" includes ethynyl and propynyl, and straight-chained or branched butynyl, pentynyl and hexynyl groups.

As used herein the expression "$(C_1-C_4)$acyl" shall have the same meaning as "$(C_1-C_4)$alkanoyl", which can also be represented structurally as "R—CO—," where R is a $(C_1-C_3)$alkyl as defined herein. Additionally, "$(C_1-C_3)$alkylcarbonyl" shall mean same as $(C_1-C_4)$acyl. Specifically, "$(C_1-C_4)$acyl" shall mean formyl, acetyl or ethanoyl, propanoyl, n-butanoyl, etc. Derived expressions such as "$(C_1-C_4)$acyloxy" and "$(C_1-C_4)$acyloxyalkyl" are to be construed accordingly.

As used herein, the expression "$(C_1-C_{15})$perfluoroalkyl" means that all of the hydrogen atoms in said alkyl group are replaced with fluorine atoms. Illustrative examples include trifluoromethyl and pentafluoroethyl, and straight-chained or branched heptafluoropropyl, nonafluorobutyl, undecafluoropentyl and tridecafluorohexyl groups. Derived expression, "$(C_1-C_{15})$perfluoroalkoxy", is to be construed accordingly.

As used herein, the expression "$(C_6-C_{10})$aryl" means substituted or unsubstituted phenyl or naphthyl. Specific examples of substituted phenyl or naphthyl include o-, p-, m-tolyl, 1,2-, 1,3-, 1,4-xylyl, 1-methylnaphthyl, 2-methylnaphthyl, etc. "Substituted phenyl" or "substituted naphthyl" also include any of the possible substituents as further defined herein or one known in the art. Derived expression, "$(C_6-C_{10})$arylsulfonyl," is to be construed accordingly.

As used herein, the expression "$(C_6-C_{10})$aryl$(C_1-C_4)$alkyl" means that the $(C_6-C_{10})$aryl as defined herein is further attached to $(C_1-C_4)$alkyl as defined herein. Representative examples include benzyl, phenylethyl, 2-phenylpropyl, 1-naphthylmethyl, 2-naphthylmethyl and the like.

As used herein, the expression "heteroaryl" includes all of the known heteroatom containing aromatic radicals. Representative 5-membered heteroaryl radicals include furanyl, thienyl or thiophenyl, pyrrolyl, isopyrrolyl, pyrazolyl, imidazolyl, oxazolyl, thiazolyl, isothiazolyl, and the like. Representative 6-membered heteroaryl radicals include pyridinyl, pyridazinyl, pyrimidinyl, pyrazinyl, triazinyl, and the like radicals. Representative examples of bicyclic heteroaryl radicals include, benzofuranyl, benzothiophenyl, indolyl, quinolinyl, isoquinolinyl, cinnolyl, benzimidazolyl, indazolyl, pyridofuranyl, pyridothienyl, and the like radicals.

As used herein, the expression "heterocycle" includes all of the known reduced heteroatom containing cyclic radicals. Representative 5-membered heterocycle radicals include tetrahydrofuranyl, tetrahydrothiophenyl, pyrrolidinyl, 2-thiazolinyl, tetrahydrothiazolyl, tetrahydrooxazolyl, and the like. Representative 6-membered heterocycle radicals include piperidinyl, piperazinyl, morpholinyl, thiomorpholinyl, and the like. Various other heterocycle radicals include, without limitation, aziridinyl, azepanyl, diazepanyl, diazabicyclo[2.2.1]hept-2-yl, and triazocanyl, and the like.

"Halogen" or "halo" means chloro, fluoro, bromo, and iodo.

In a broad sense, the term "substituted" is contemplated to include all permissible substituents of organic compounds. In a few of the specific embodiments as disclosed herein, the term "substituted" means substituted with one or more substituents independently selected from the group consisting of $(C_1-C_6)$alkyl, $(C_2-C_6)$alkenyl, $(C_1-C_6)$perfluoroalkyl, phenyl, hydroxy, —$CO_2H$, an ester, an amide, $(C_1-C_6)$ alkoxy, $(C_1-C_6)$thioalkyl, $(C_1-C_6)$perfluoroalkoxy, —$NH_2$, Cl, Br, I, F, —$NH(C_1-C_6)$alkyl, and —$N((C_1-C_6)$alkyl$)_2$. However, any of the other suitable substituents known to one skilled in the art can also be used in these embodiments.

It should be noted that any atom with unsatisfied valences in the text, schemes, examples and tables herein is assumed to have the appropriate number of hydrogen atom(s) to satisfy such valences.

As used herein, the terms "polymer composition," or "terpolymer composition" are used herein interchangeably and are meant to include at least one synthesized polymer or terpolymer, as well as residues from initiators, solvents or other elements attendant to the synthesis of such polymers, where such residues are understood as not being covalently incorporated thereto. Such residues and other elements considered as part of the "polymer" or "polymer composition" are typically mixed or co-mingled with the polymer such that they tend to remain therewith when it is transferred between vessels or between solvent or dispersion media. A polymer composition can also include materials added after synthesis of the polymer to provide or modify specific properties of such composition. Such materials include, but are not limited to solvent(s), antioxidant(s), photoinitiator(s), sensitizers and other materials as will be discussed more fully below.

By the term "derived" is meant that the polymeric repeating units are polymerized (formed) from, e.g., polycyclic norbornene-type monomers, in accordance with formula (I) wherein the resulting polymers are formed by 2,3 enchainment of norbornene-type monomers:

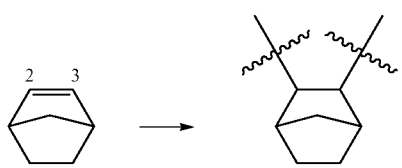

The term "low K" refers in general to a dielectric constant less than that of thermally formed silicon dioxide (3.9) and when used in reference to a "low-K material" it will be understood to mean a material having a dielectric constant of less than 3.9.

The term "photodefinable" refers to the characteristic of a material or composition of materials, such as a polymer composition in accordance with embodiments of the present invention, to be formed into, in and of itself, a patterned layer or a structure. In alternate language, a "photodefinable layer" does not require the use of another material layer formed thereover, for example a photoresist layer, to form the aforementioned patterned layer or structure. It will be further understood that a polymer composition having such a characteristic be employed in a pattern forming scheme to form a patterned film/layer or structure. It will be noted that such a scheme incorporates an "imagewise exposure" of the photodefinable material or layer. Such imagewise exposure being taken to mean an exposure to actinic radiation of selected portions of the layer, where non-selected portions are protected from such exposure to actinic radiation.

The phrase "a material that photonically forms a catalyst" refers to a material that, when exposed to "actinic radiation" will break down, decompose, or in some other way alter its molecular composition to form a compound capable of initiating a crosslinking reaction in the polymer, where the term "actinic radiation" is meant to include any type of radiation capable of causing the aforementioned change in molecular composition. For example, any wavelength of ultraviolet or visible radiation regardless of the source of such radiation or radiation from an appropriate X-ray and electron beam source. Non-limiting examples of suitable materials that "photonically form catalyst" include photoacid generators and photobase generators such as are discussed in detail below. It should also be noted that generally "a material that photonically forms a catalyst" will also form a catalyst if heated to an appropriate temperature. Such exposures are sometimes desirable after developing a positive tone image and to fix the images post developing by blanket exposure to a suitable radiation.

The term "cure" (or "curing") as used in connection with a composition, e.g., "a cured composition," shall mean that at least a portion of the crosslinkable components which are encompassed by the composition are at least partially crosslinked. In some embodiments of the present invention, the crosslinking is sufficient to render the polymer film insoluble in the developer and in some other embodiments the polymer film is insoluble in commonly used solvents. One skilled in the art will understand that the presence and degree of crosslinking (crosslink density) can be determined by a variety of methods, such as dynamic mechanical thermal analysis (DMTA). This method determines the glass transition temperature and crosslink density of free films of coatings or polymers. These physical properties of a cured material are related to the structure of the crosslinked network. Higher crosslink density values indicate a higher degree of crosslinking in the coating or film.

Monomers

Various monomers as described herein which are part of polymer embodiments in accordance with the present invention are generally known in the art. In general, the polymers of this invention encompass a wide range of "polycyclic" repeating units. As defined herein, the terms "polycyclic olefin" or "polycycloolefin" mean the same and are used interchangeably to represent several of the monomeric compounds used to prepare the polymers of this invention. As a representative example of such a compound or a monomer is "norbornene-type" monomer and is generally referred to herein as addition polymerizable monomer (or the resulting repeating unit), that encompass at least one norbornene moiety such as shown below:

The simplest norbornene-type or polycyclic olefin monomer encompassed by embodiments in accordance with the present invention is norbornene itself, also known as bicyclo[2.2.1]hept-2-ene. However, the term norbornene-type monomer or repeating unit is used herein to mean norbornene itself as well as any substituted norbornene(s), or substituted and unsubstituted higher cyclic derivatives thereof. Representative examples of such monomers include but not limited to bicyclo[2.2.2]oct-2-ene, 1,2,3,4,4a,5,8,8a-octahydro-1,4:5,8-dimethanonaphthalene, 1,4,4a,5,6,7,8,8a-octahydro-1,4-epoxy-5,8-methanonaphthalene, and the like.

As mentioned above, the "norbornene-type" monomeric compounds employed in this invention can be synthesized by any of the procedures known to one skilled in the art. Specifically, several of the starting materials used in the preparation of the first type of monomers used herein are known or are themselves commercially available. The monomers employed herein as well as several of the precursor compounds may also be prepared by methods used to prepare similar compounds as reported in the literature and as further described herein.

In general, an economical route for the preparation of monomers of formula (I), wherein m=0, relies on the Diels-Alder addition reaction in which to cyclopentadiene (CPD, IV) is reacted with a suitable dienophile of formula (V) or (VI) at suitable reaction temperatures which are typically at elevated temperatures to form the monomers of formula (I) or (II) generally shown by the following reaction scheme I:

Scheme I

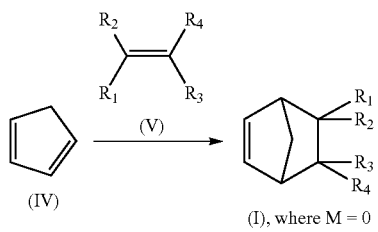

Wherein $R_1$, $R_2$, $R_3$ and $R_4$ are as defined herein.

Other monomeric compounds of formula (I), wherein m=1 or 2 can also be prepared similarly by the thermolysis of dicyclopentadiene (DCPD, VI) in the presence of a suitable dienophile of formula (V). In this approach, the compound of formula (I) formed itself acts as a dienophile and reacts with CPD, IV to give a compound of formula (I), where m=1, which can again be reacted with another molecule of CPD, IV to forma a compound of formula (I), where m=2, and so on, as shown in Scheme II:

Scheme II

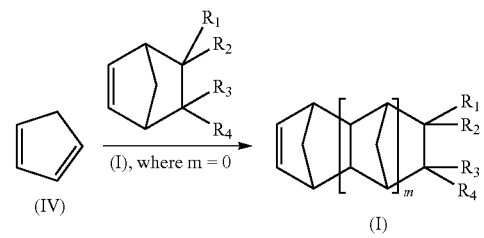

Wherein m, $R_1$, $R_2$, $R_3$ and $R_4$ are as defined herein. The dienophile of formula (V) are either generally available commercially or can be prepared following any of the known literature procedures.

Similarly, various other monomers of formulae (II) as described herein are also known in the art or are themselves commercially available. Also, monomers of formula (II) can be synthesized by similar procedures as described above.

Polymers

Embodiments in accordance with the present invention encompass polymers having at least one repeating unit derived from a norbornene-type monomer of formula (I) as defined herein.

Thus, in accordance with the practice of this invention there is provided a polymer comprising:

a repeating unit represented by formula (IA), said repeating unit is derived from a monomer of formula (I):

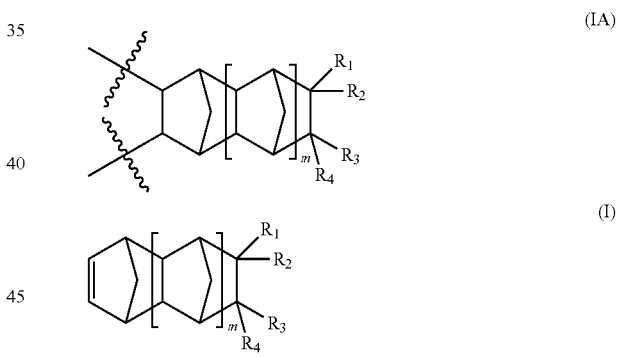

wherein:

 represents a position at which the bonding takes place with another repeat unit;

m is an integer 0, 1 or 2;

at least one of $R_1$, $R_2$, $R_3$ and $R_4$ is a group of the formula (A):

$$-R-CO-Ar-(Y)_n \quad (A)$$

wherein:

R is a divalent radical selected from the group consisting of substituted or unsubstituted ($C_1$-$C_6$)alkylene, substituted or unsubstituted ($C_3$-$C_8$)cycloalkylene, substituted or unsubstituted ($C_1$-$C_6$)alkyleneAr, and Ar;

Ar is a divalent radical selected from the group consisting of substituted or unsubstituted phenylene, substituted or unsubstituted biphenylene and substituted or unsubstituted naphthalene;

Y is hydroxy or ($C_1$-$C_6$)acyloxy; and n is an integer 1 to 9;

the remaining $R_1$, $R_2$, $R_3$ and $R_4$ independently represents hydrogen, linear or branched $(C_1-C_{16})$alkyl, hydroxy$(C_1-C_{12})$alkyl, perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$alkyl, perfluoro$(C_6-C_{10})$aryl, perfluoro$(C_6-C_{10})$aryl$(C_1-C_3)$alkyl, $(C_5-C_{10})$heteroaryl, $(C_5-C_{10})$heteroaryl$(C_1-C_3)$alkyl, hydroxy, $(C_1-C_{12})$alkoxy, $(C_3-C_{12})$cycloalkoxy, $(C_6-C_{12})$bicycloalkoxy, $(C_7-C_{14})$tricycloalkoxy, —$(CH_2)_a$—(O—$(CH_2)_b)_c$—O—$(C_1-C_4)$alkyl, where a, b and c are integers from 1 to 4, $(C_6-C_{10})$aryloxy$(C_1-C_3)$alkyl, $(C_5-C_{10})$heteroaryloxy$(C_1-C_3)$alkyl, $(C_6-C_{10})$aryloxy, $(C_5-C_{10})$heteroaryloxy, $(C_1-C_6)$acyloxy and halogen.

In some embodiments the polymer of this invention encompasses a monomer of formula (I) wherein the group of formula (A) is selected from the group consisting of

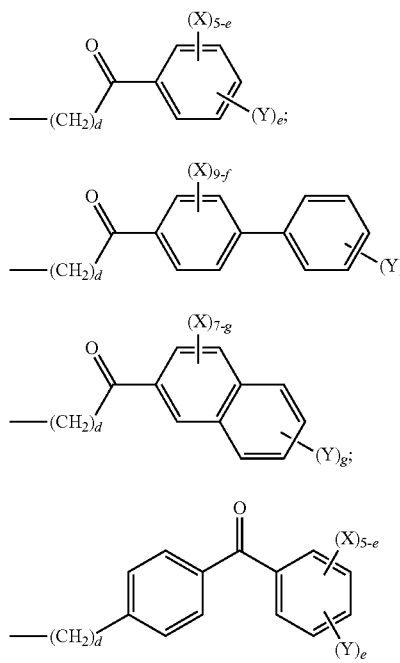

wherein:

d is an integer from 1 to 6;

e is an integer from 1 to 5;

f is an integer from 1 to 9;

g is an integer from 1 to 7;

X is selected from hydrogen, linear or branched $(C_1-C_6)$alkyl, hydroxy$(C_1-C_6)$alkyl and perfluoro$(C_1-C_6)$alkyl; and Y is hydroxy or acetoxy.

Accordingly, in this aspect of the invention any of the suitable monomer of formula (I), which contains any of the pendent group of formulae (A1), (A2), (A3) or (A4) can be employed to form the polymer of this invention.

In a further aspect of this invention, the polymer of this invention further encompasses one or more repeating units distinct from each other and each represented by formula (IIA), said repeating unit is derived from a corresponding monomer of formula (II):

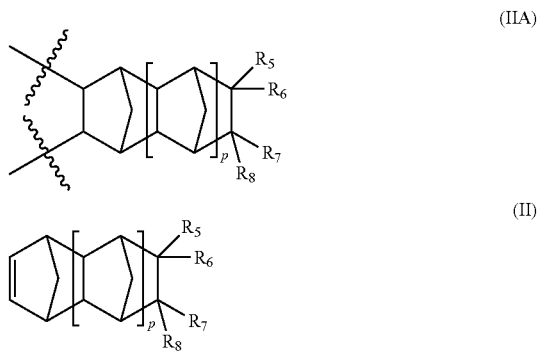

wherein:

⁓ represents a position at which the bonding takes place with another repeat unit;

p is an integer 0, 1 or 2;

$R_5$, $R_6$, $R_7$ and $R_8$ independently represents hydrogen, linear or branched $(C_1-C_{16})$alkyl, hydroxy$(C_1-C_{12})$alkyl, perfluoro$(C_1-C_{12})$alkyl, hydroxyperfluoro$(C_1-C_6)$alkyl$(C_1-C_6)$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$alkyl, perfluoro$(C_6-C_{10})$aryl, perfluoro$(C_6-C_{10})$aryl$(C_1-C_3)$alkyl, $(C_5-C_{10})$heteroaryl, $(C_5-C_{10})$heteroaryl$(C_1-C_3)$alkyl, hydroxy, $(C_1-C_{12})$alkoxy, $(C_3-C_{12})$cycloalkoxy, $(C_6-C_{12})$bicycloalkoxy, $(C_7-C_{14})$tricycloalkoxy, —$(CH_2)_a$—(O—$(CH_2)_b)_c$—O—$(C_1-C_4)$alkyl, where a, b and c are integers from 1 to 4, $(C_6-C_{10})$aryloxy$(C_1-C_3)$alkyl, $(C_5-C_{10})$heteroaryloxy$(C_1-C_3)$alkyl, $(C_6-C_{10})$aryloxy, $(C_5-C_{10})$heteroaryloxy, $(C_1-C_6)$acyloxy, halogen and $(C_1-C_6)$alkyl-COOR$_9$ where $R_9$ is hydrogen or $(C_1-C_{12})$alkyl.

In some embodiments of this invention the polymer of this invention encompasses one or more monomers of formula (II) wherein p is 0; $R_5$, $R_6$, $R_7$ and $R_8$ are independently represents hydrogen, linear or branched $(C_1-C_{12})$ alkyl, hydroxyhexafluoropropylmethyl, phenyl$(C_1-C_3)$alkyl, —$(CH_2)_2CO_2H$, —$(CH_2)_a$—(O—$(CH_2)_b)_c$—O—$(C_1-C_4)$ alkyl, where a is 1 or 2, b is 2 to 4 and c is 2 or 3.

As noted, the polymer of this invention generally encompasses at least one monomer each of formulae (I) and (II). However, the polymer of this invention can encompass more than one monomer of formulae (I) and (II), which are distinct from each other, all such combinations are part of this invention. Accordingly, in one of the embodiments of this invention, the polymer of this invention encompasses two or more distinct repeat units of formula (I) with at least one monomer of formula (II). In yet another embodiment of this invention, the polymer of this invention encompasses two or more distinct repeat units of formula (II) with at least one monomer of formula (I).

Useful monomers for embodiments in accordance with the present invention are described generally herein and are further described by the monomer and substituent structures provided herein. It should further be noted that the polymer of this invention generally encompasses any molar amounts of repeat units derived from one or more monomers of formula (I) and repeat units derived from one or more monomers of formula (II).

Generally speaking, as to various possible substituents defined for $R_1$, $R_2$, $R_3$, $R_4$ . . . it should be noted that such substituents can broadly be defined as "hydrocarbyl" group, except where a specific group is defined as for example a group of formula (A) for a monomer of formula (I). As defined hereinabove, such definition of "hydrocarbyl" group includes any $C_1$ to $C_{30}$ alkyl, aryl, aralkyl, alkaryl, cycloalkyl, or heteroalkyl group. Representative alkyl groups include, but are not limited to, methyl, ethyl, propyl, isopropyl, butyl, isobutyl, sec-butyl, tert-butyl, pentyl, neopentyl, hexyl, heptyl, octyl, nonyl, and decyl. Representative cycloalkyl groups include, but are not limited to, adamantyl, cyclopentyl, cyclohexyl, and cyclooctyl. Representative aryl groups include, but are not limited to, phenyl, naphthyl, and anthracenyl. Representative aralkyl groups include, but are not limited to, benzyl and phenethyl. In addition, it should be noted that the hydrocarbyl groups mentioned above can be substituted, that is to say at least one of the hydrogen atoms can be replaced with, for example, $(C_1-C_{10})$alkyl, haloalkyl, perhaloalkyl, aryl, and/or cycloalkyl group(s). Representative substituted cycloalkyl groups include, among others, 4-t-butylcyclohexyl and 2-methyl-2-adamantyl. A non-limiting representative substituted aryl group is 4-t-butylphenyl.

Various types of norbornene-type monomers of formula (I) can be employed in order to form the polymers of this invention which contain a group of formula (A). Exemplary monomers which form such repeating unit include but not limited to those monomers selected from the group consisting of

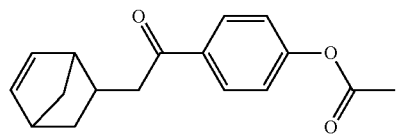

4-(2-(bicyclo[2.2.1]hept-5-en-2-yl)acetyl)phenyl acetate (NBCH$_2$C(O)PhOAc)

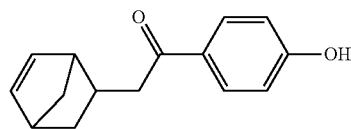

2-(bicyclo[2.2.1]hept-5-en-2-yl)-1-(4-hydroxyphenyl)ethan-1-one (NBCH$_2$C(O)PhOH)

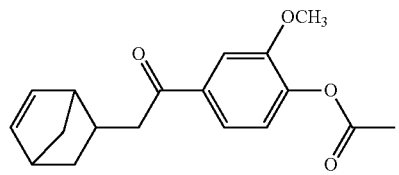 [SMILES: COc1cc(C(=O)CC2CC3C=CC2C3)ccc1OC(C)=O]

4-(2-(bicyclo[2.2.1]hept-5-en-2-yl)acetyl)-2-methoxyphenyl acetate

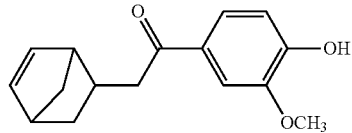 [SMILES: COc1cc(C(=O)CC2CC3C=CC2C3)ccc1O]

2-(bicyclo[2.2.1]hept-5-en-2-yl)-1-(4-hydroxy-3-methoxyphenyl)ethan-1-one

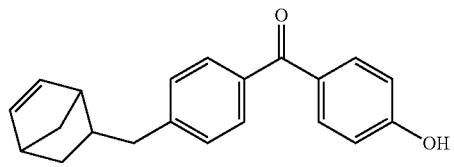 [SMILES: O=C(c1ccc(O)cc1)c1ccc(CC2CC3C=CC2C3)cc1]

(4-(bicyclo[2.2.1]hept-5-en-2-ylmethyl)phenyl)(4-hydroxyphenyl)methanone

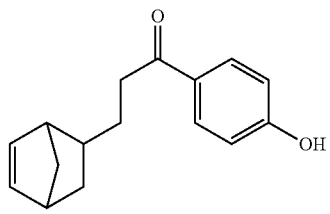 [SMILES: O=C(CCC1CC2C=CC1C2)c1ccc(O)cc1]

3-(bicyclo[2.2.1]hept-5-en-2-yl)-1-(4-hydroxyphenyl)propan-1-one

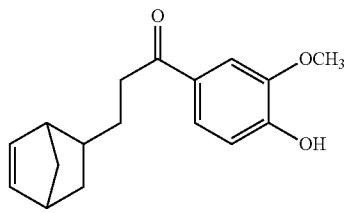 [SMILES: COc1cc(C(=O)CCC2CC3C=CC2C3)ccc1O]

3-(bicyclo[2.2.1]hept-5-en-2-yl)-1-(4-hydroxy-3-methoxyphenyl)propan-1-one

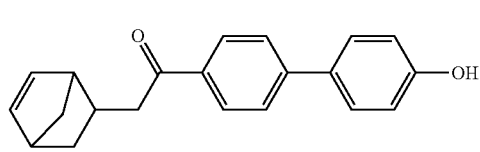 [SMILES: O=C(CC1CC2C=CC1C2)c1ccc(-c2ccc(O)cc2)cc1]

2-(bicyclo[2.2.1]hept-5-en-2-yl)-1-(4'-hydroxy-[1,1'-biphenyl]-4-yl)ethan-1-one

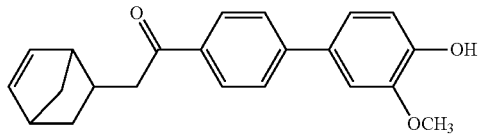

2-(bicyclo[2.2.1]hept-5-en-2-yl)-1-(4'-hydroxy-3'-methoxy-[1,1'-biphenyl]-4-yl)ethan-1-one

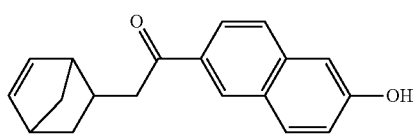

2-(bicyclo[2.2.1]hept-5-en-2-yl)-1-(6-hydroxynaphthalen-2-yl)ethan-1-one; and

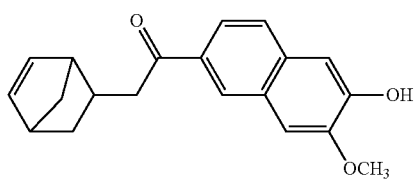 [SMILES: COc1cc2cc(C(=O)CC3CC4C=CC3C4)ccc2cc1O]

2-(bicyclo[2.2.1]hept-5-en-2-yl)-1-(6-hydroxy-7-methoxynaphthalen-2-yl)ethan-1-one Similarly, various types of norbornene-type monomers of formula (II) can be employed in order to form the polymers of this invention. Exemplary monomers which form such repeating unit include but not limited to those monomers selected from the group consisting of:

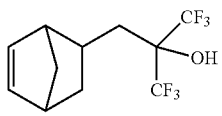

2-(bicyclo[2.2.1]hept-5-en-2-ylmethyl)-1,1,1,3,3,3-hexafluoropropan-2-ol (HFANB)

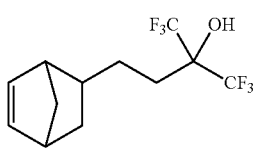 [SMILES: OC(CCC1CC2C=CC1C2)(C(F)(F)F)C(F)(F)F]

4-(bicyclo[2.2.1]hept-5-en-2-yl)-1,1,1-trifluoro-2-(trifluoromethyl)butan-2-ol (HFACH$_2$NB)

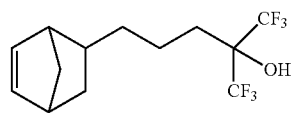 [SMILES: OC(CCCC1CC2C=CC1C2)(C(F)(F)F)C(F)(F)F]

5-(bicyclo[2.2.1]hept-5-en-2-yl)-1,1,1-trifluoro-2-(trifluoromethyl)pentan-2-ol (HFACH$_2$CH$_2$NB)

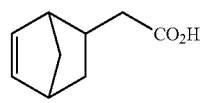

2-(bicyclo[2.2.1]hept-5-en-2-yl)acetic acid (NBCH$_2$CO$_2$H)

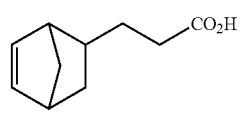 [SMILES: O=C(O)CCC1CC2C=CC1C2]

3-(bicyclo[2.2.1]hept-5-en-2-yl)propanoic acid (NBCH$_2$CH$_2$CO$_2$H)

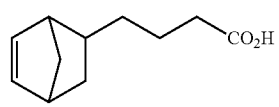 [SMILES: O=C(O)CCCC1CC2C=CC1C2]

4-(bicyclo[2.2.1]hept-5-en-2-yl)butanoic acid (NBCH$_2$CH$_2$CH$_2$CO$_2$H)

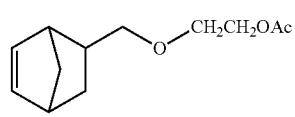

2-(bicyclo[2.2.1]hept-5-en-2-ylmethoxy)ethyl acetate (NBCH$_2$GlyOAc)

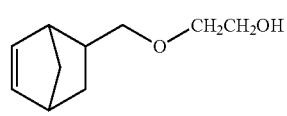

2-(bicyclo[2.2.1]hept-5-en-2-ylmethoxy)ethanol
((NBCH₂GlyOH))

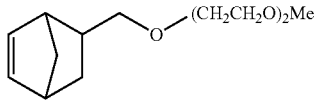

5-((2-(2-methoxyethoxy)ethoxy)methyl)bicyclo
[2.2.1]hept-2-ene (NBTON)

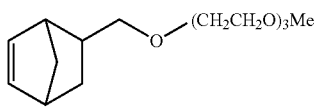

1-(bicyclo[2.2.1]hept-5-en-2-yl)-2,5,8,11-tetraoxado-
decane (NBTODD)

Various other monomers which are within the scope of monomer of formula (II) which can also be used in forming the polymer of this invention include the following without any limitation:

norbornene (NB)

5-methylbicyclo[2.2.1]hept-2-ene (MeNB)

5-butylbicyclo[2.2.1]hept-2-ene (BuNB)

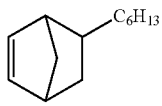

5-hexylbicyclo[2.2.1]hept-2-ene (HexNB)

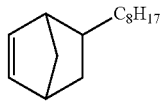

5-octylbicyclo[2.2.1]hept-2-ene (OctNB)

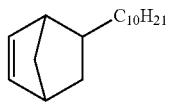

5-decylbicyclo[2.2.1]hept-2-ene (DecNB)

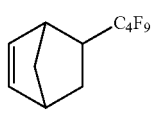

5-perfluorobutylbicyclo[2.2.1]hept-2-ene (NBC₄F₉)

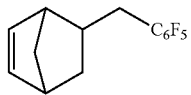

5-pentafluorobenzylbicyclo[2.2.1]hept-2-ene
(PFBNB)

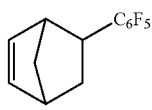

5-pentafluorophenylbicyclo[2.2.1]hept-2-ene
(PFPNB)

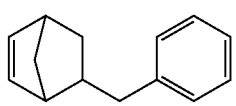 [SMILES: C1=CC2CC1CC2Cc1ccccc1]

| 17 | 18 |
|---|---|
| 5-benzylbicyclo[2.2.1]hept-2-ene (BzNB) | 5-(4-(trifluoromethyl)benzyl)bicyclo[2.2.1]hept-2-ene (NBCH$_2$C$_6$H$_4$CF$_3$) |

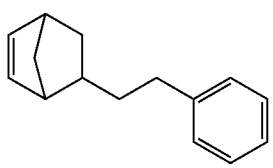 [SMILES: C1=CC2CC1CC2CCc1ccccc1]

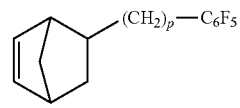

5-phenethylbicyclo[2.2.1]hept-2-ene (PENB)

5-((perfluorophenyl)alkyl)bicyclo[2.2.1]hept-2-ene (NBalkylC$_6$F$_5$), where p=1 (methyl), 2 (ethyl), 3 (propyl), 4 (butyl), 5 (pentyl) or 6 (hexyl)

1,2,3,4,4a,5,8,8a-octahydro-1,4:5,8-dimethanonaphthalene (TD)

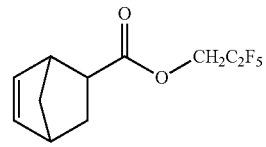

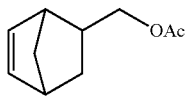 [SMILES: CC(=O)OCC1CC2C=CC1C2]

2,2,3,3,3-pentafluoropropyl bicyclo[2.2.1]hept-5-ene-2-carboxylate (PFPrCNB)

bicyclo[2.2.1]hept-5-en-2-ylmethyl acetate (MeOAcNB)

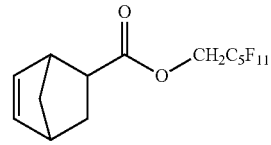

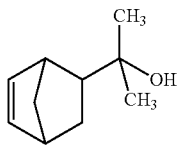

perfluoropentylmethyl bicyclo[2.2.1]hept-5-ene-2-carboxylate (PFPMeCNB)

2-(bicyclo[2.2.1]hept-5-en-2-yl)propan-2-ol (NBXOH)

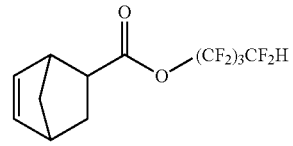

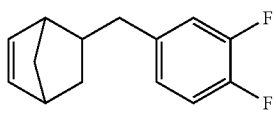

1,1,2,2,3,3,4,4-octafluorobutyl bicyclo[2.2.1]hept-5-ene-2-carboxylate (FOCHNB)

5-(3,4-difluorobenzyl)bicyclo[2.2.1]hept-2-ene (NBCH$_2$C$_6$H$_3$F$_2$)

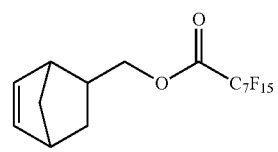

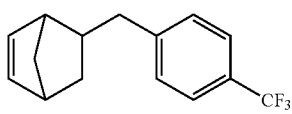

bicyclo[2.2.1]hept-5-en-2-ylmethyl perfluorooctanoate (CsPFAcNB); and

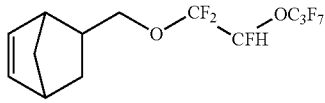

5-((1,1,2-trifluoro-2-(perfluoropropoxy)ethoxy)methyl)bicyclo[2.2.1]hept-2-ene (PPVENB)

In some embodiments, the polymer of this invention is a copolymer, which is selected from the group consisting of:

a copolymer of 2-(bicyclo[2.2.1]hept-5-en-2-yl)-1-(4-hydroxyphenyl)ethan-1-one (NBCH₂C(O)PhOH) and 2-(bicyclo[2.2.1]hept-5-en-2-ylmethyl)-1,1,1,3,3,3-hexafluoropropan-2-ol (HFANB);

a copolymer of 2-(bicyclo[2.2.1]hept-5-en-2-yl)-1-(4-hydroxyphenyl)ethan-1-one (NBCH₂C(O)PhOH) and 4-(bicyclo[2.2.1]hept-5-en-2-yl)-1,1,1-trifluoro-2-(trifluoromethyl)butan-2-ol (HFACH₂NB);

a copolymer of 2-(bicyclo[2.2.1]hept-5-en-2-yl)-1-(4-hydroxyphenyl)ethan-1-one (NBCH₂C(O)PhOH) and 5-(bicyclo[2.2.1]hept-5-en-2-yl)-1,1,1-trifluoro-2-(trifluoromethyl)pentan-2-ol (HFACH₂CH₂NB);

a copolymer of 2-(bicyclo[2.2.1]hept-5-en-2-yl)-1-(4-hydroxyphenyl)ethan-1-one (NBCH₂C(O)PhOH) and 2-(bicyclo[2.2.1]hept-5-en-2-yl)acetic acid (NBCH₂CO₂H);

a copolymer of 2-(bicyclo[2.2.1]hept-5-en-2-yl)-1-(4-hydroxyphenyl)ethan-1-one (NBCH₂C(O)PhOH) and 3-(bicyclo[2.2.1]hept-5-en-2-yl)propanoic acid (NBCH₂CH₂CO₂H);

a copolymer of 3-(bicyclo[2.2.1]hept-5-en-2-yl)-1-(4-hydroxyphenyl)propan-1-one and 2-(bicyclo[2.2.1]hept-5-en-2-ylmethyl)-1,1,1,3,3,3-hexafluoropropan-2-ol (HFANB);

a copolymer of 3-(bicyclo[2.2.1]hept-5-en-2-yl)-1-(4-hydroxyphenyl)propan-1-one and 4-(bicyclo[2.2.1]hept-5-en-2-yl)-1,1,1-trifluoro-2-(trifluoromethyl)butan-2-ol (HFACH₂NB);

a copolymer of 3-(bicyclo[2.2.1]hept-5-en-2-yl)-1-(4-hydroxyphenyl)propan-1-one and 5-(bicyclo[2.2.1]hept-5-en-2-yl)-1,1,1-trifluoro-2-(trifluoromethyl)pentan-2-ol (HFACH₂CH₂NB);

a copolymer of 3-(bicyclo[2.2.1]hept-5-en-2-yl)-1-(4-hydroxyphenyl)propan-1-one and 2-(bicyclo[2.2.1]hept-5-en-2-yl)acetic acid (NBCH₂CO₂H); and a copolymer of 3-(bicyclo[2.2.1]hept-5-en-2-yl)-1-(4-hydroxyphenyl)propan-1-one to and 3-(bicyclo[2.2.1]hept-5-en-2-yl)propanoic acid (NBCH₂CH₂CO₂H).

In some other embodiments, the polymer of this invention is a terpolymer, which is selected from the group consisting of:

a terpolymer of 2-(bicyclo[2.2.1]hept-5-en-2-yl)-1-(4-hydroxyphenyl)ethan-1-one (NBCH₂C(O)PhOH), 2-(bicyclo[2.2.1]hept-5-en-2-ylmethyl)-1,1,1,3,3,3-hexafluoropropan-2-ol (HFANB) and 2-(bicyclo[2.2.1]hept-5-en-2-yl)acetic acid (NBCH₂CO₂H);

a terpolymer of 2-(bicyclo[2.2.1]hept-5-en-2-yl)-1-(4-hydroxyphenyl)ethan-1-one (NBCH₂C(O)PhOH), 4-(bicyclo[2.2.1]hept-5-en-2-yl)-1,1,1-trifluoro-2-(trifluoromethyl)butan-2-ol (HFACH₂NB) and 2-(bicyclo[2.2.1]hept-5-en-2-yl)acetic acid (NBCH₂CO₂H);

a terpolymer of 2-(bicyclo[2.2.1]hept-5-en-2-yl)-1-(4-hydroxyphenyl)ethan-1-one (NBCH₂C(O)PhOH), 5-(bicyclo[2.2.1]hept-5-en-2-yl)-1,1,1-trifluoro-2-(trifluoromethyl)pentan-2-ol (HFACH₂CH₂NB) and 2-(bicyclo[2.2.1]hept-5-en-2-yl)acetic acid (NBCH₂CO₂H);

a terpolymer of 2-(bicyclo[2.2.1]hept-5-en-2-yl)-1-(4-hydroxyphenyl)ethan-1-one (NBCH₂C(O)PhOH), 2-(bicyclo[2.2.1]hept-5-en-2-ylmethyl)-1,1,1,3,3,3-hexafluoropropan-2-ol (HFANB) and 3-(bicyclo[2.2.1]hept-5-en-2-yl)propanoic acid (NBCH₂CH₂CO₂H);

a terpolymer of 3-(bicyclo[2.2.1]hept-5-en-2-yl)-1-(4-hydroxyphenyl)propan-1-one, 3-(bicyclo[2.2.1]hept-5-en-2-yl)propanoic acid (NBCH₂CH₂CO₂H) and 2-(bicyclo[2.2.1]hept-5-en-2-ylmethyl)-1,1,1,3,3,3-hexafluoropropan-2-ol (HFANB);

a terpolymer of 3-(bicyclo[2.2.1]hept-5-en-2-yl)-1-(4-hydroxyphenyl)propan-1-one, 3-(bicyclo[2.2.1]hept-5-en-2-yl)propanoic acid (NBCH₂CH₂CO₂H) and 4-(bicyclo[2.2.1]hept-5-en-2-yl)-1, 1, 1-trifluoro-2-(trifluoromethyl)butan-2-ol (HFACH₂NB);

a terpolymer of 3-(bicyclo[2.2.1]hept-5-en-2-yl)-1-(4-hydroxyphenyl)propan-1-one, 3-(bicyclo[2.2.1]hept-5-en-2-yl)propanoic acid (NBCH₂CH₂CO₂H) and 5-(bicyclo[2.2.1]hept-5-en-2-yl)-1,1,1-trifluoro-2-(trifluoromethyl)pentan-2-ol (HFACH₂CH₂NB); and a terpolymer of 2-(bicyclo[2.2.1]hept-5-en-2-yl)-1-(4-hydroxyphenyl)ethan-1-one (NBCH₂C(O)PhOH), 3-(bicyclo[2.2.1]hept-5-en-2-yl)propanoic acid (NBCH₂CH₂CO₂H) and 5-((2-(2-methoxyethoxy)ethoxy)methyl)-bicyclo[2.2.1]hept-2-ene (NBTON).

In yet another embodiment, the polymer of this invention is selected from the group consisting of:

a copolymer of 2-(bicyclo[2.2.1]hept-5-en-2-yl)-1-(4-hydroxyphenyl)ethan-1-one (NBCH₂C(O)PhOH) and 2-(bicyclo[2.2.1]hept-5-en-2-ylmethyl)-1,1,1,3,3,3-hexafluoropropan-2-ol (HFANB);

a terpolymer of 2-(bicyclo[2.2.1]hept-5-en-2-yl)-1-(4-hydroxyphenyl)ethan-1-one, 2-(bicyclo[2.2.1]hept-5-en-2-ylmethyl)-1,1,1,3,3,3-hexafluoropropan-2-ol (HFANB) and 3-(bicyclo[2.2.1]hept-5-en-2-yl)propanoic acid (NBCH₂CH₂CO₂H); and a terpolymer of 2-(bicyclo[2.2.1]hept-5-en-2-yl)-1-(4-hydroxyphenyl)ethan-1-one (NBCH₂C(O)PhOH), 3-(bicyclo[2.2.1]hept-5-en-2-yl)propanoic acid (NBCH₂CH₂CO₂H) and 5-((2-(2-methoxyethoxy)ethoxy)methyl)-bicyclo[2.2.1]hept-2-ene (NBTON).

Polymer Preparation

In general, the polymers of this invention can be prepared by any one of the known procedures in the art. For instance, one or more monomers of formula (I) as described herein can be polymerized along with at least one monomer of formula (II) to form the polymers of this invention containing the respective monomeric repeat units as represented by formula (IA) or (IIA). Generally, vinyl addition polymerization method can be employed to form the polymers of this invention using a suitable transition metal catalyst or an initiator, such as for example, nickel or palladium. In general, the polymerization can be carried out either in solution using a desirable solvent or in mass.

Any molar ratios of one or more monomers of monomer of formula (I) can be employed with one or more monomers of formula (II) to form the polymers of this invention. Thus, the polymers of this invention generally incorporate repeating units of formula (IA) from about 1 mole percent to about 99 mole percent. The remaining repeat units are being derived from a combination of repeat units of one or more repeat units of formula (IIA). Accordingly, in some embodiments a copolymer of this invention is having a molar ratio of repeat units of formulae (IA): (IIA) from about 1:99 to 99:1; in some other embodiments it can be 2:98 to 98:2. Accordingly, in some embodiments the molar ratio of (IA) to (IIA) can be 5:95, 10:90, 20:80, 30:40, 50:50, 60:40, 70:30, 80:20, 90:10, and the like. Similarly, the polymer of this invention can be a terpolymer containing any combinations of monomeric repeat units of formula (IA) or (IIA) in which the molar ratios of the repeat units can be 40:30:30, 40:40:20, 50:20:30, 50:25:25, 50:30:20, 50:40:10, 50:45:5, 60:20:20, and the like.

Again, as noted above, one or more distinct types of repeat units of formula (IA) may be present in the polymer of this invention. Accordingly, in one of the embodiments the polymer of this invention contains only one type of repeat unit of formula (IA). In another embodiment, the polymer of this invention contains two distinctive types of repeat units of formula (IA). In other embodiments the polymer of this invention contains more than two distinctive types of repeat units of formula (IA). Similarly, various different types of repeat units of formulae (IIA) can be used to form the polymers of this invention.

The polymers formed according to this invention generally exhibit a weight average molecular weight ($M_w$) of at least about 5,000. In another embodiment, the polymer of this invention has a $M_w$ of at least about 10,000. In yet another embodiment, the polymer of this invention has a $M_w$ of at least about 15,000. In some other embodiments, the polymer of this invention has a $M_w$ of at least about 25,000. In some other embodiments, the polymer of this invention has a $M_w$ higher than 25,000. The weight average molecular weight ($M_w$) of the polymer can be determined by any of the known techniques, such as for example, by gel permeation chromatography (GPC) equipped with suitable detector and calibration standards, such as differential refractive index detector calibrated with narrow-distribution polystyrene standards.

Polymer Compositions/Applications

As mentioned above, embodiments in accordance with the present invention are also directed to various layer forming photosensitive polymer compositions containing polymers encompassing one or more norbornene-type repeating units of formula (IA) and one or more repeating units of formula (IIA). Such polymer compositions may further contain a photo active compound (PAC), an epoxy resin and a solvent. Further, such compositions are capable of forming films useful as self-imageable layers in the manufacture of microelectronic and optoelectronic devices. That is to say that when image-wise exposed to actinic radiation, such layers (or films) can be developed to form a patterned film, where such pattern is reflective of the image through which the film was exposed.

In this manner, structures can be provided that are, or are to become, a part of such microelectronic and/or optoelectronic devices. For example, such films may be useful as low-K dielectric layers in liquid crystal displays or in microelectronic devices. It will be noted that such examples are only a few of the many uses for such a self-imageable film, and such examples do not serve to limit the scope of such films or the polymers and polymer compositions that are used to form them.

Advantageously, it has now been found that polymer compositions of this invention provide several desirable properties especially when compared to several of the polymers reported in the literature for similar applications. For instance, it has been observed that several of the styrene-maleic anhydride copolymers exhibit very high dark field loss (DFL) making them less desirable for positive tone (PT) applications. As used herein, the term DFL or the unexposed area film thickness loss is a measure of the film thickness loss after image-wise exposure to suitable actinic radiation and developing in a suitable developer. That is, the polymer compositions of this invention are cast into films, the film thicknesses before and after development in an unexposed region of the film are measured and reported as percent loss of the film thickness in areas of the film that was not exposed to the radiation. Generally, higher the percent of DFL, poorer the performance of the polymer composition, which means that the unexposed areas of the film are more susceptible to the developed and thus dissolves in the developer. In addition, the measured DFL also depends on the developed time employed. Generally, longer the develop time higher the DFL.

Surprisingly, the compositions of this invention exhibit very low DFL in that the unexposed area of the film is not lost even at shorter develop time. Accordingly, in some embodiments of this invention the DFL of the compositions may be less than about 20 percent; in some other embodiments DFL can be less than 25 percent; and in some other embodiments the DFL may be in the range of from about 0 percent to 30 percent. At the same time the develop time for the compositions of this invention can generally range from about 10 seconds to about 80 seconds; in some other embodiments the develop time can range from about 20 seconds to about 60 seconds; and in some other embodiments the develop time can range from about 30 seconds to about 40 seconds.

In addition, advantageously it has also been found that the compositions of this invention exhibit excellent dissolution rate in the developing solvent, such as for example, aqueous based alkali developer, including tetramethylammonium hydroxide (TMAH). This can further be tailored based on the molar content of maleimide repeat units in the polymer. Generally, it has now been found that by judicious selection of the molar ratio of ring opened maleic anhydride repeat units and the maleimide repeat units it is now possible to control the dissolution rate of the composition of this invention to the desirable range. Generally, increasing the molar amounts of maleimide repeat units results in lower dissolution rates, while improving the thermal reflow properties, which aspect becomes more important during downstream operations after developing the films. Furthermore, the compositions of this invention retain much needed lithographic resolution, photospeed and high degree of chemical resistance, among various other desirable properties.

In addition, the compositions of this invention contain one or more photoactive compounds (PACs). Generally, any PAC which can bring about the desirable effect in a positive tone composition can be employed herein. Non-limiting examples of suitable photoactive compounds (PACs) that can be employed in these photosensitive compositions encompasses a photoactive group, such as 1,2-naphthoquinonediazide-5-sulfonyl moiety and/or a 1,2-naphthoquinonediazide-4-sulfonyl moiety as represented by structural formulae (IIIa) and (IIIb), respectively:

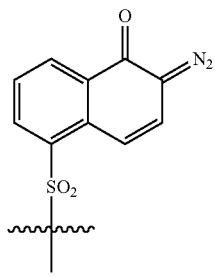

(IIIa)

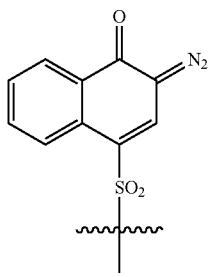

(IIIb)

Other such photoactive moieties, among others, include sulfonyl benzoquinone diazide group represented by structural formula (IIIc):

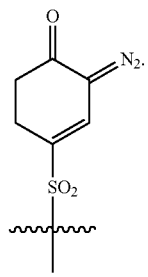

(IIIc)

Generally, the functional groups of formulae (IIIa), (IIIb) and/or (IIIc) are incorporated into the photosensitive composition as an esterification product of the respective sulfonyl chloride (or other reactive moiety) and a phenolic compound, such as one or more of the exemplary compounds represented below collectively as structural formulae (IIIa) to (IIIag). Thus, any one, or any mixture of two or more of such esterification products are combined with the resin in forming the to photosensitive resin compositions of the present invention. In the formulae (VII) below, Q may represent any of the structures (IIIa), (IIIb) or (IIIc). Advantageously, when a portion of a film or a layer of the photosensitive composition is exposed to appropriate electromagnetic radiation, these esterification products generate a carboxylic acid which enhances the solubility of such exposed portion in an aqueous alkali solution as compared to any unexposed portions of such film. Generally, such photosensitive materials are incorporated into the composition in an amount from 1 to 50 parts by weight material to 100 parts by weight resin, i.e., the polymer of this invention; and typically from about 2 to about 30 parts by weight. Where the specific ratio of the photosensitive material to resin is a function of the dissolution rate of exposed portions as compared to unexposed portions and the amount of radiation required to achieve a desired dissolution rate differential.

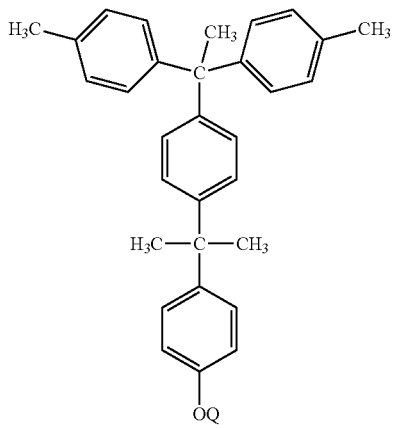

(VIIIa)

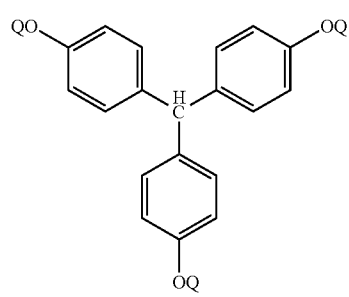

(VIIIb)

-continued
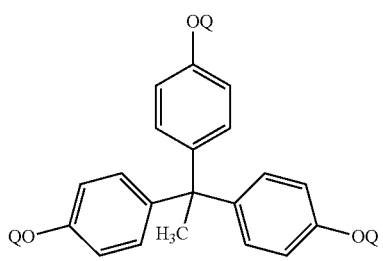
(VIIIc)
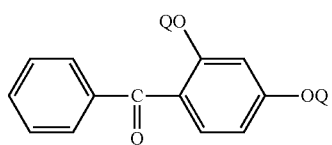
(VIIId)
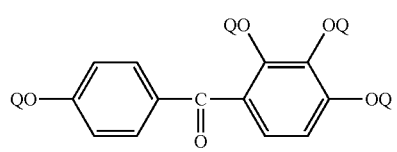
(VIIIe)
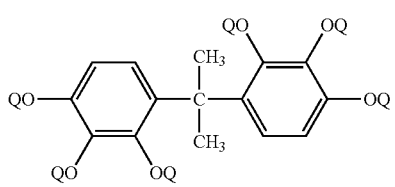
(VIIIf)
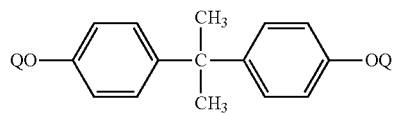
(VIIIg)
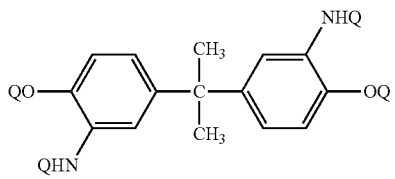
(VIIIh)
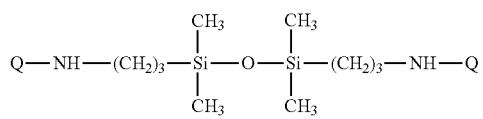
(VIIIi)
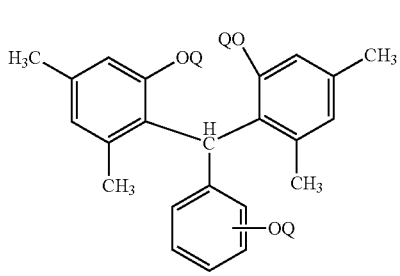
(VIIIj)
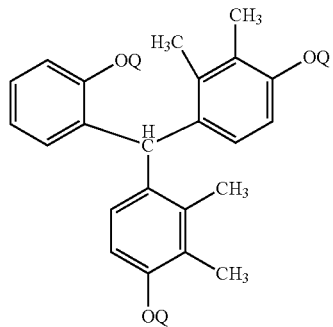
(VIIIk)
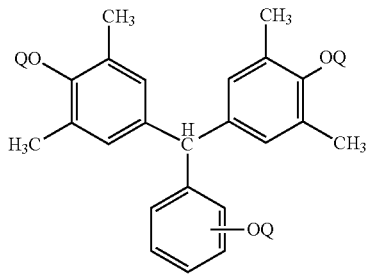
(VIIIl)
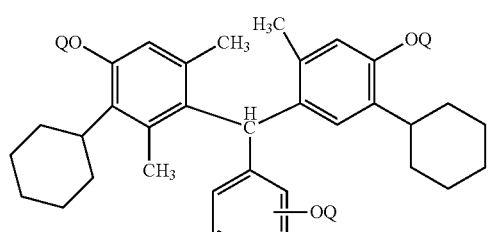
(VIIIm)
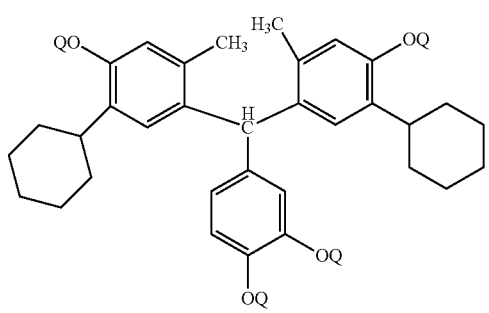
(VIIIn)

-continued
(VIIIo)
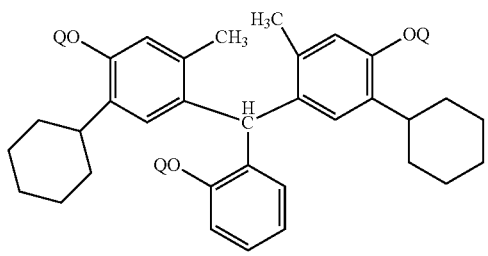
(VIIIp)
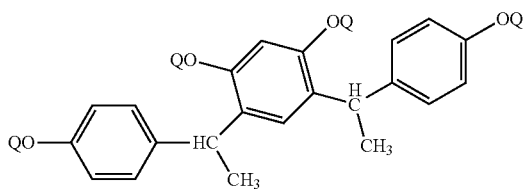
(VIIIq)
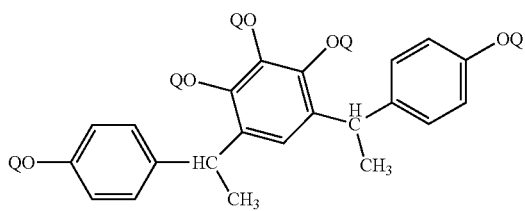
(VIIIr)
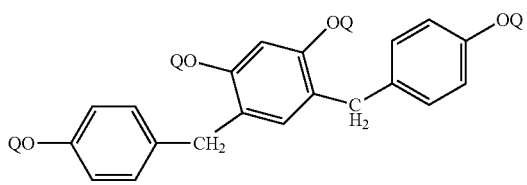
(VIIIs)
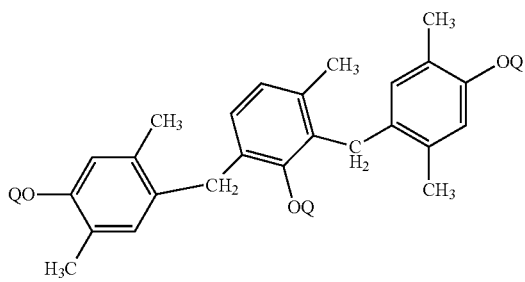
(VIIIt)
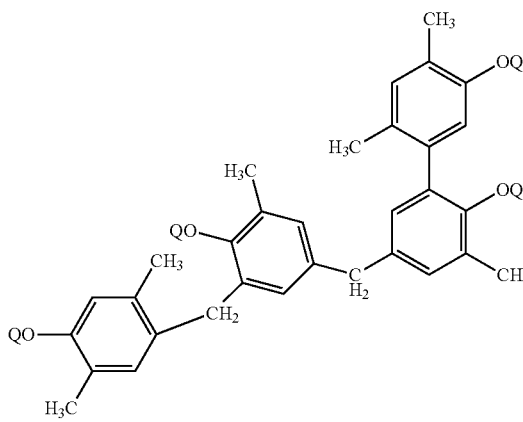
(VIIIu)
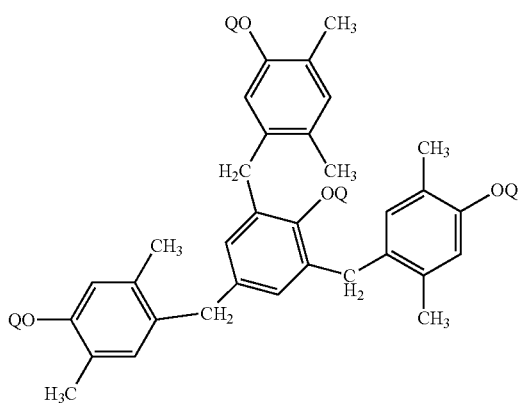
(VIIIv)
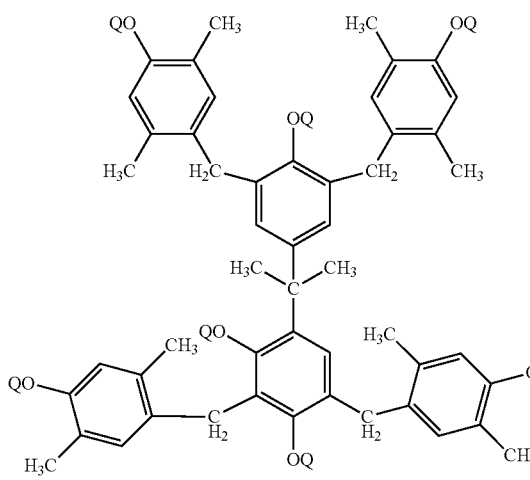
(VIIIw)
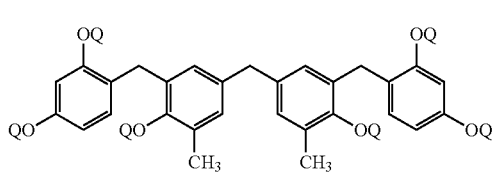
(VIIIx)

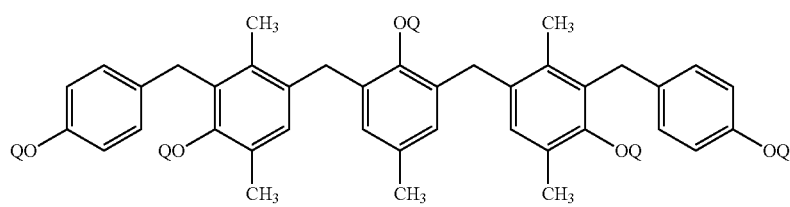
(VIIIy)

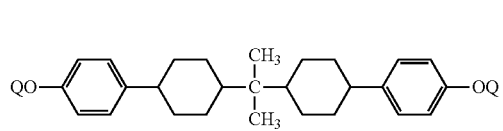
(VIIIz)

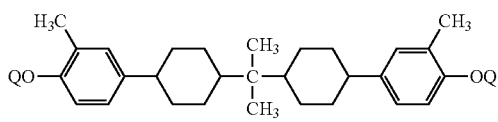
(VIIIaa)

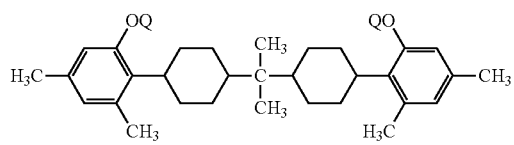
(VIIIab)

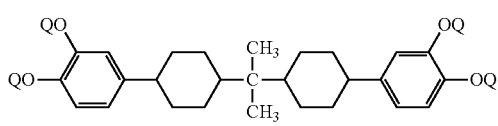
(VIIIac)

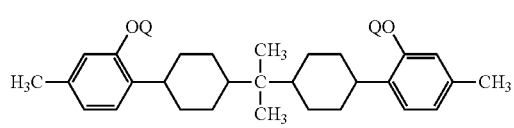
(VIIIad)

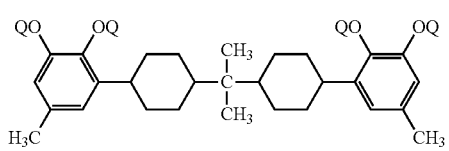
(VIIIae)

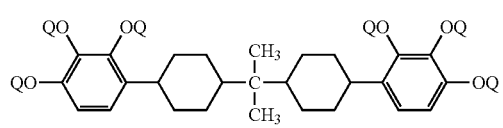
(VIIIaf)

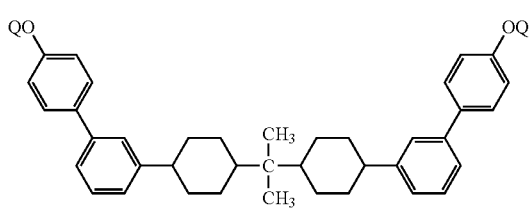
(VIIIag)

In the above listed PACs of formulae (VIIIa) to (VIIIag), Q refers to any one of photoactive moieties of formulae (IIIa), (IIIb) or (IIIc). Several of the PACs listed above are commercially available. For example, PAC-5570 of formula (VIIIc) (St. Jean Photochemicals Inc., Quebec, Canada), SCL6 of formula (VIIId) (Secant Chemicals Inc., Winchendon, Mass., USA), TrisP-3M6C-2-201 of formula (VIIIo) (also referred to herein as TrisP), collectively TS-200, TS-250 and TS-300 of formula (VIIIa), and 4NT-300 of formula (VIIIe) (all from Toyo Gosei Co. Ltd., Chiba, Japan). It should be noted that for PACs of the types TS-200, TS-250 and TS-300, the degree of substitution of Qs also varies based on the product used. For instance, TS-200 is substituted with 67% of Q, TS-250 is substituted with 83% of Q, and TS-300 with 100% of Q, the unsubstituted portion being hydrogen. Again, Q in each of these instances refers to one of group (VIIa), (VIIb) or (VIIc).

Exemplary epoxies and other cross-linking additives, as mentioned above, include, but are not limited to, bisphenol A epoxy resin (LX-01—where n=1 to 2, Daiso Chemical Co., Osaka, Japan or EPON™ 828 resin with a molecular weight less than 700), 2,2'-((((1-(4-(2-(4-(oxiran-2-yl-methoxy)phenyl)propan-2-yl)phenyl)ethane-1,1-diyl)bis(4,1-phenylene))bis(oxy))bis(methylene))bis(oxirane) (Techmore VG3101L—Mitsui Chemical Inc.), trimethylolpropane triglycidylether (TMPTGE—CVC Specialty Chemicals, Inc.), 1,1,3,3,5,5-hexamethyl-1,5-bis(3-(oxiran-2-ylmethoxy)propyl)trisiloxane (DMS-E09—Gelest, Inc.), liquid epoxy resins (D.E.R.™ 732, where n=8 to 10, and D.E.R.™ 736, where n=4 to 6—both from Dow Chemical Company), bis(4-(oxiran-2-ylmethoxy)phenyl) methane (EPON™ 862, Hexion Specialty Chemicals, Inc.), triglycidyl ether of poly(oxypropylene)epoxide ether of glycerol (commercially available as Heloxy 84 or GE-36 from Momentive Specialty Chemicals Inc.), 2-((4-(tert-butyl)phenoxy)methyl)oxirane (commercially available as Heloxy 65 from Momentive Specialty Chemicals Inc.) and silicone modified epoxy compound (commercially available as BY16-115 from Toray-Dow Corning Silicone Co., Ltd.) as shown below:

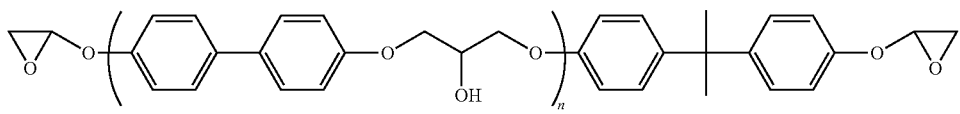

LX-01

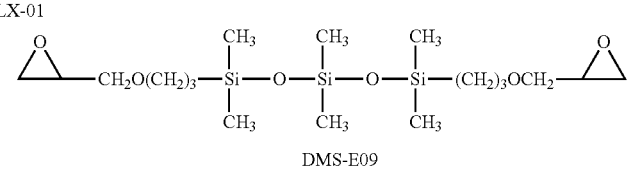

DMS-E09

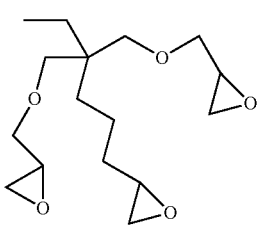

TMPTGE-2,2'-(((2-ethyl-2-((oxiran-2-ylmethoxy)methyl)
propane-1,3-diyl)bis(oxy))bis(methylene))bis(oxirane),
commercially available as Denacol EX-321(Nagase)

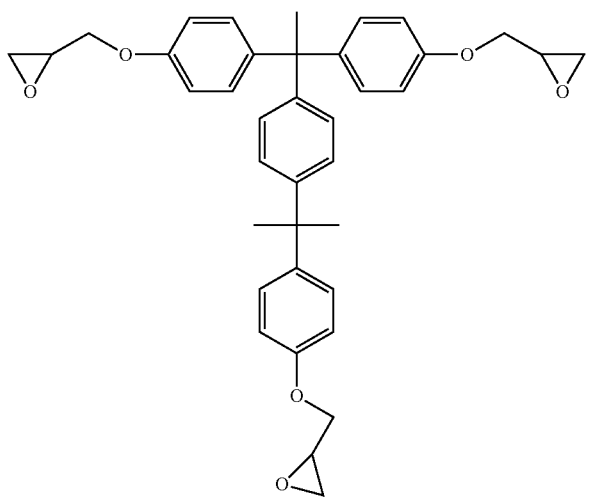

Techmore VG3101L

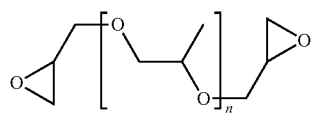

D.E.R.™ 732, where n = 8 to 10 and
D.E.R.™ 736, where n = 4 to 6

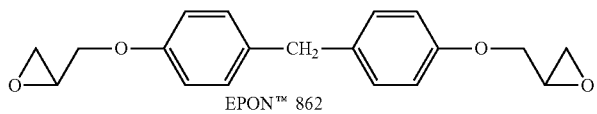

EPON™ 862

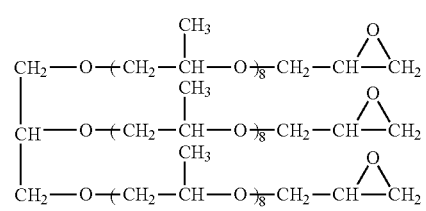

triglycidyl ether of poly(oxypropylene)epoxide ether of glycerol,
commercially available as Heloxy 84 or
GE-36 from Momentive Specialty Chemicals Inc.;

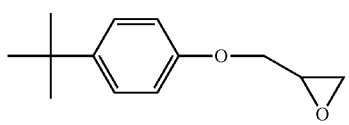

2-((4-(tert-butyl)phenoxy)methyl)oxirane,
commercially available as Heloxy 65 from
Momentive Specialty Chemicals Inc.; and

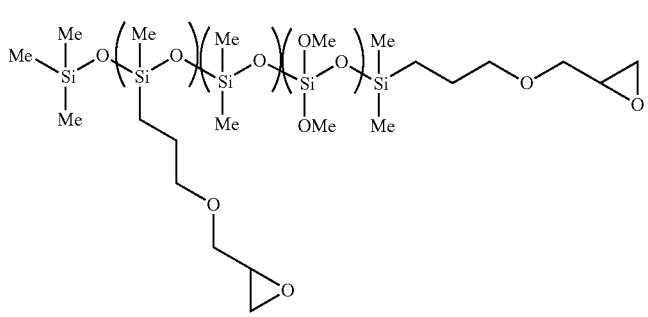

Silicone modified epoxy compound commercially available
as BY16-115 from Toray-Dow Corning Silicone Co., Ltd.

Still other exemplary epoxy resins or cross-linking additives include, among others Araldite MTO163 and Araldite CY179 (manufactured by Ciba Geigy); and EHPE-3150 and Epolite GT300 (manufactured by Daicel Chemical).

The amount of epoxy compound may also vary as noted for PACs. The amount can vary generally from about 0 to 50 parts by weight of the polymer and typically from about 2 to about 30 parts by weight, although other advantageous amounts of such materials are also appropriate and within the scope of the present invention. In addition, one or more different types of epoxy compounds as enumerated herein can be used in the composition of this invention and the amounts of each can thus be varied as needed.

Advantageously, it has now been found that judicious selection of the epoxy compound in the compositions of this invention may offer certain unexpected benefits. For instance, it has now been found that epoxy compounds having certain desirable epoxy equivalent weight and Log P offers certain surprising benefits. As used herein "Log P" is a measure of the partition-coefficient (P), that is, the ratio of concentrations of a compound in a mixture of two immiscible phases at equilibrium (water and 1-octanol). Generally, lower the Log P value higher the miscibility of such an epoxy compound in water. Such benefits include, among other things, improved DFL properties and thermal reflow properties. These features become more apparent from the specific examples that follow. It should further be noted that various benefits obtained from this invention depends on many factors as already described herein and some of which may be readily appreciated by one of skill in the art. Accordingly, in some embodiments the photosensitive compositions of this invention contains an epoxy compound having an epoxy equivalent weight higher than about 200. In other embodiments such epoxy equivalent weight may range from about 200 to 400 or higher. Further, Log P values of such epoxy compounds may be in the range of from about −0.3 to about −0.8; in other embodiments such Log P values are from about −0.4 to about −0.6. In some embodiments the epoxy compound is having an equivalent weight of about 300 to 400 and Log P of about −0.3 to −0.4.

It will be understood that exemplary embodiments of the present invention, can include other suitable components and/or materials such as are necessary for formulating and using the polymer compositions in accordance with the present invention. Such other suitable components and/or materials include one or more components selected from sensitizer components, solvents, catalyst scavengers, adhesion promoters, stabilizers, and reactive diluents.

The polymer compositions in accordance with the present invention may further contain optional components as may be useful for the purpose of improving properties of both the composition and the resulting layer, for example the sensitivity of the composition to a desired wavelength of exposure radiation. Examples of such optional components include various additives such as a dissolution promoter, a surfactant, a silane coupling agent, a leveling agent, an antioxidant, a fire retardant, a plasticizer, a crosslinking agent or the like. Such additives include, but are not limited to, bisphenol A and 5-norbornene-2,3-dicarboxylic acid as a dissolution promoter, a silicone surfactant such as TSF4452 (Toshiba Silicone Co., Ltd), a silane coupling agent such as γ-aminopropyl triethoxysilane, a leveling agent, such as γ-(methacryloyloxy propyl) trimethoxysilane, antioxidants such as pentaerythritol tetrakis(3-(3,5-di-tert-butyl-4-hydroxyphenyl)propionate) (IRGANOX™ 1010 from BASF), 3,5-bis(1,1-dimethylethyl)-4-hydroxy-octadecyl ester benzenepropanoic acid (IRGANOX™ 1076 from BASF) and thiodiethylene bis[3-(3,5-di-tert.-butyl-4-hydroxy-phenyl) propionate] (IRGANOX™ 1035 from BASF), a fire retardant such as a trialkyl phosphate or other organic phosphoric compound and a plasticizer such as, poly(propylene glycol).

In addition, various other additives/components can be added to the composition of this invention, which is used for the formation of the photoimageable layer such that its mechanical and other properties can be tailored as desired. Also, other additives can be used to alter the processability, which include increase the stability of the polymer to thermal and/or light radiation. In this regard, the additives can include, but are not limited to, crosslinking agents, adhesion promoters, and the like. Non-limiting examples of such compounds are selected from the group consisting of the following, commercially available materials are indicated by such commercial names.

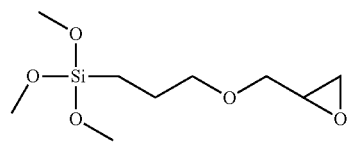

trimethoxy(3-(oxiran-2-ylmethoxy)propyl)silane, also commonly known as 3-glycidoxypropyl trimethoxysilane (KBM-403E from Shin-Etsu Chemical Co., Ltd.);

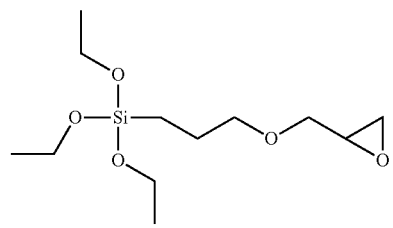 [SMILES: CCO[Si](CCCOCC1CO1)(OCC)OCC]

triethoxy(3-(oxiran-2-ylmethoxy)propyl)silane, also commonly known as 3-glycidoxypropyl triethoxysilane (KBE-403 from Shin-Etsu Chemical Co., Ltd.);

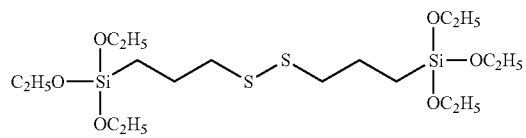

((triethoxysilyl)propyl)disulfide (Si-75 or Si-266 from Evonik);

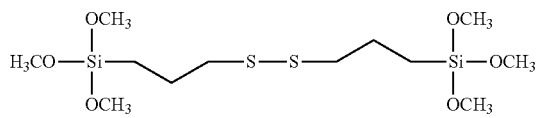

35
((trimethoxysilyl)propyl)disulfide;

36
bis(4-(2-phenylpropan-2-yl)phenyl)amine, commercially available as Naugard-445 from Addivant;

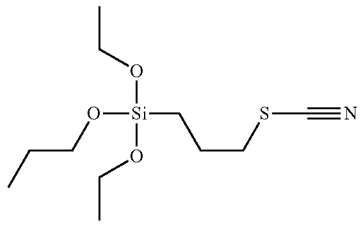 [SMILES: CCCO[Si](CCCSC#N)(OCC)OCC]

diethoxy(propoxy)(3-thiocyanatopropyl)silane, commercially available as SIT-7908.0 from Gelest;

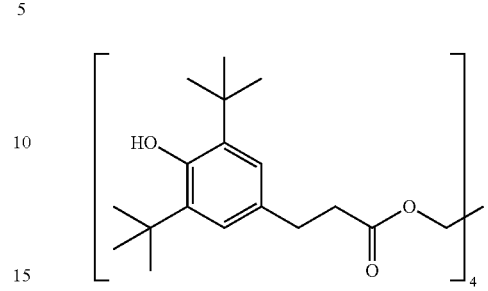

pentaerythritol tetrakis(3-(3,5-di-tert-butyl-4-hydroxyphenyl)propionate) (Irganox 1010 from BASF);

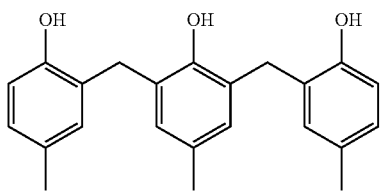 [SMILES: Cc1ccc(O)c(Cc2cc(C)cc(Cc3cc(C)ccc3O)c2O)c1]

2,2'-((2-hydroxy-5-methyl-1,3-phenylene)bis(methylene))bis(4-methylphenol) (AO-80 from TCI Japan);

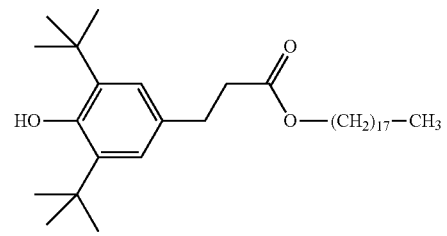

3,5-bis(1,1-dimethylethyl)-4-hydroxy-octadecyl ester benzenepropanoic acid (Irganox 1076 from BASF); and

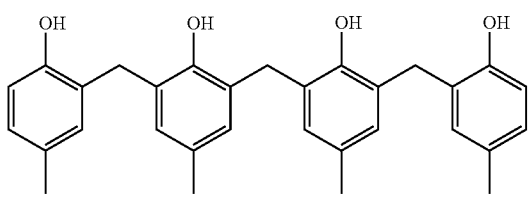 [SMILES: Cc1ccc(O)c(Cc2cc(C)cc(Cc3cc(C)cc(Cc4cc(C)ccc4O)c3O)c2O)c1]

6,6'-methylenebis(2-(2-hydroxy-5-methylbenzyl)-4-methylphenol) (4-PC);

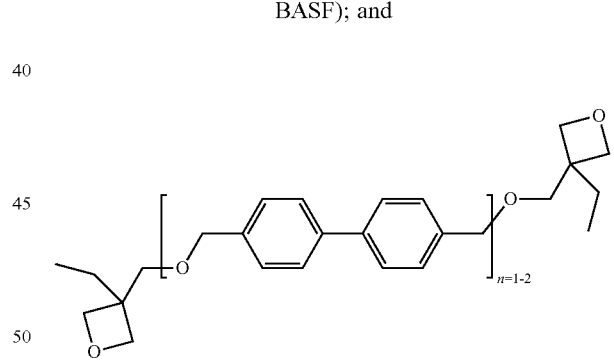

3,3'-[[1,1'-biphenyl]-4,4'-diylbis(methyleneoxymethylene)]bis[3-ethyl-oxetane]

In the embodiments of the present invention, these components are generally dissolved in a solvent and prepared into a varnish form to be used. As a solvent, there may be used N-methyl-2-pyrrolidone (NMP), γ-butyrolactone (GBL), N,N-dimethylacetamide (DMAc), dimethylsulfoxide (DMSO), diethyleneglycol dimethylether, diethyleneglycol diethylether, diethyleneglycol dibutylether, propyleneglycol monomethylether (PGME), dipropylene glycol monomethylether, propyleneglycol monomethylether acetate (PGMEA), methyl lactate, ethyl lactate, butyl lactate, methylethyl ketone (MEK), methyl amyl ketone (MAK),

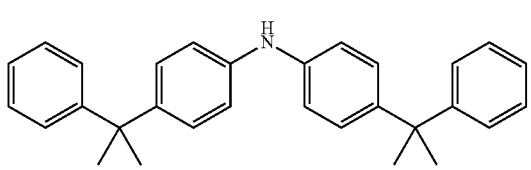 [SMILES: CC(C)(c1ccccc1)c1ccc(Nc2ccc(C(C)(C)c3ccccc3)cc2)cc1]

cyclohexanone, tetrahydrofuran, methyl-1,3-butyleneglycolacetate, 1,3-butyleneglycol-3-monomethylether, methylpyruvate, ethyl pyruvate, methyl-3-methoxypropionate or the like. They may be used solely or mixed by optionally selecting two or more kinds.

As mentioned above, some embodiments of the present invention encompass structures, such as optoelectronic structures, which include at least one self-imageable layer formed from a film of a polymer composition embodiment in accordance with the present invention. As previously mentioned, the polymer of such a composition embodiment encompasses at least one repeating unit of formula (IA) derived from a norbornene-type monomer containing a phenolic pendent group, at least one repeating unit of formula (IIA) derived from other norbornene type monomer as described herein. As also noted, the polymer composition embodiment further encompasses at least one casting solvent, one or more photo active compound (PAC) as enumerated herein and one or more epoxy resin as described above.

The aforementioned structure embodiments of the present invention are readily formed by first casting a polymer composition over an appropriate substrate to form a layer thereof, then heating the substrate to an appropriate temperature for an appropriate time, where such time and temperature are sufficient to remove essentially all of the casting solvent of such composition. After such first heating, the layer is image-wise exposed to an appropriate wavelength of actinic radiation. As one of skill in the art knows, for the "positive tone" compositions, the aforementioned image-wise exposure causes the PAC contained in exposed portions of the layer to undergo a chemical reaction that enhances the dissolution rate of such exposed portions to an aqueous base solution (generally a solution of tetramethylammonium hydroxide (TMAH)). In this manner, such exposed portions are removed and unexposed portions remain. Next a second heating is performed to cause cross-linking of portions of the polymer with the epoxy additive, thus essentially "curing" the polymer of such unexposed portions to form an aforementioned structure embodiment of the present invention.

It should be noted again that the second heating step is performed for the imaged and developed layer. In this step of second heating, the thermal curing of the polymer layer can be achieved with the added additives, such as epoxies and/or other crosslinking agents as described herein.

The following examples, without being limiting in nature, illustrate methods for making polymer embodiments in accordance with the present invention, and various compositions for forming photopatternable dielectric materials.

It should further be noted that the following examples are detailed descriptions of methods of preparation and use of certain compounds/monomers, polymers and compositions of the present invention. The detailed preparations fall within the scope of, and serve to exemplify, the more generally described methods of preparation set forth above. The examples are presented for illustrative purposes only, and are not intended as a restriction on the scope of the invention. As used in the examples and throughout the specification the ratio of monomer to catalyst is based on a mole to mole basis.

EXAMPLES (General)

The following definitions have been used in the Examples that follow unless otherwise indicated:

Endo/exo-NBCH$_2$C(O)C$_6$H$_4$OAc: Endo/exo-4-(2-(bicyclo[2.2.1]hept-5-en-2-yl)acetyl)phenyl acetate; NBCH$_2$C(O)PhOH: 2-(bicyclo[2.2.1]hept-5-en-2-yl)-1-(4-hydroxyphenyl)ethan-1-one; NBPhOAc: 4-(bicyclo[2.2.1]hept-5-en-2-yl)phenyl acetate; NBPhOH: 4-(bicyclo[2.2.1]hept-5-en-2-yl)phenol; NBCH$_2$CH$_2$CO$_2$H: 3-(bicyclo[2.2.1]hept-5-en-2-yl)propanoic acid; HFANB: 2-(bicyclo[2.2.1]hept-5-en-2-ylmethyl)-1,1,1,3,3,3-hexafluoropropan-2-ol; NBTON: 5-((2-(2-methoxyethoxy)ethoxy)methyl)-bicyclo[2.2.1]hept-2-ene; RBF: round bottomed flask; THF: tetrahydrofuran; EtOAc: ethyl acetate; MeOH: methanol; MTBE: methyl tert-butyl ether; TFA: trifluoroacetic acid; HCl: hydrochloric acid; TMAH: tetramethylammonium hydroxide; NMP: N-methyl-2-pyrrolidone; PGMEA: propyleneglycol monomethylether acetate; TMPTGE: trimethylolpropane triglycidylether; TrisP-3M6C-2(5)-201 and TrisP-3M6C-2(4)-201 are PACs of formula (VIIIa) as described herein; Naugard 445: bis(4-(2-phenylpropan-2-yl)phenyl)amine; Irganox 1010: pentaerythritol tetrakis(3-(3,5-di-tert-butyl-4-hydroxyphenyl)propionate); Si-75: ((triethoxysilyl)propyl)disulfide; KBM-403E: 3-glycidoxypropyl trimethoxysilane; Heloxy 84 or GE-36: triglycidyl ether of poly(oxypropylene)epoxide ether of glycerol; EPON 862: bis(4-(oxiran-2-ylmethoxy)phenyl)methane; PEODGE: polyethylene oxide diglycidyl ether (M$_n$~500); TS: total solid; HPLC: high performance liquid chromatography; GC: gas chromatography; MS: mass spectroscopy; LCMS: liquid chromatography/mass spectrometer; GPC: gel permeation chromatography; VWD: variable wavelength detector; FID: flame ionization detector; M$_w$: weight average molecular weight; M$_n$: number average molecular weight; PDI: polydispersity index; NMR: nuclear magnetic resonance.

Monomers of Formula (I)

The following Example 1 illustrates the preparation of one of the monomers of formula (I). Various other monomers of formula (I) as described herein can be made using similar procedures and employing the appropriate starting materials.

Example 1

Endo/exo-4-(2-(bicyclo[2.2.1]hept-5-en-2-yl)acetyl)phenyl acetate

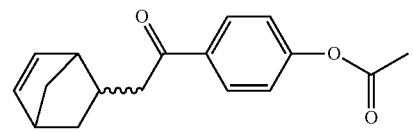 [SMILES: CC(=O)Oc1ccc(C(=O)CC2CC3C=CC2C3)cc1]

The title compound was synthesized from 4-acetoxy benzoyl chloride and exo-/endo-NBCH$_2$ZnBr (BASF, 1574.1 mL, 1.3 mol, 21 wt. % in THF) was accomplished as outlined in Scheme 1 below.

Scheme 1

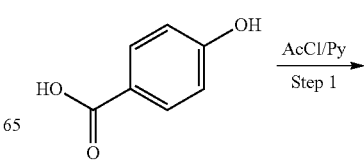

-continued

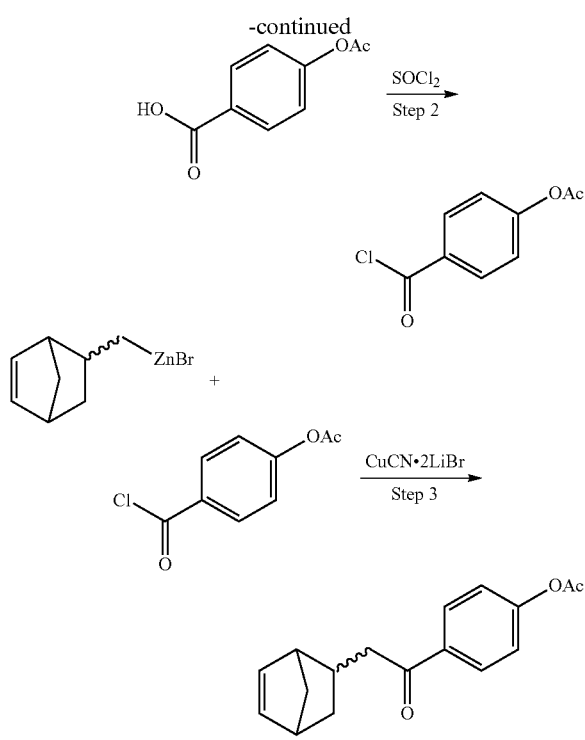

Step 1: 4-Acetoxy benzoic acid: A 2 L, 4 neck round bottomed flask (RBF) was equipped with a mechanical stirrer, thermowell, addition funnel, and condenser with nitrogen inlet. The RBF was charged with 4-hydroxy benzoic acid (250 g, 1.8 mol) in 878 mL dry pyridine. The reaction mixture was heated to 60° C. to dissolve the 4-hydroxy benzoic acid giving a clear, light yellow solution. The reaction mixture was then cooled to 0° C. during which time a white turbid solution was formed. The addition funnel was charged with 141.4 mL (1.99 mol) acetyl chloride and added slowly to the reaction mixture at 0° C. over 45 minutes. The reaction mixture was stirred at 0° C. for a further 30 minutes and then allowed to warm up to room temperature. After stirring at room temperature for 2 hours, an aliquot was removed from the reactor, quenched with ice cold water, acidified to pH 1-2 with 6N HCl and the resulting precipitate removed by filtration.

The white, turbid reaction mixture was poured into 6 L ice cold water and acidified (pH~1-2) with 1.1 L dilute HCl (1:1 ratio of $H_2O$:conc. HCl). The white precipitate was filtered and dissolved in hot MeOH (3.5 L). The hot MeOH solution was diluted with hot water (1.7 L) and the aqueous solution was cooled to 1° C. The resulting white crystals were recovered by filtration and analyzed by HPLC, 97.3% pure. The wet, white crystals (577.5 g) were dissolved in 2.5 L hot MeOH. The product was recrystallized in a mixture of water and methanol to obtain a white crystalline solid, 217.8 g (66.8% yield, 98.6% purity by HPLC). The NMR and MS were consistent with the structure. The melting point of the product was 187-190° C.

The HPLC analysis was carried out using the following conditions: Column: Restek Pinnacle C18, 150×4.6 mm; Mobile Phase: MeOH in $H_2O$+0.1% TFA; Gradient: 5% MeOH in $H_2O$ (0.1% TFA) for 2 minutes, then 5% to 100% over 20 minutes with a 8 minutes hold at 100%; Flow: 1.5 mL/min; Detected @ 254 nm (VWD); Retention time: 7.758 minutes.

Step 2—4-Acetoxy benzoyl chloride: A 5L RBF was equipped with a magnetic stir bar and condenser with nitrogen inlet. The RBF was charged with 4-acetoxy benzoic acid (217.8 g, 1.2 mol) and freshly distilled $SOCl_2$ (1438.3 g, 879.7 mL, 12 mol). The mixture was stirred and heated to reflux at ~80° C. for 3 h. After distilling off thionyl chloride under atmospheric pressure, 600 mL of dry toluene was added. Toluene and residual $SOCl_2$ were distilled off under reduced pressure and this procedure was repeated three times with a final drying under high vacuum at 65° C. bath temperature, to give 236.4 g (98.5% yield) of 4-acetoxy benzoyl chloride with >99% purity by GC and NMR. MS, $^1H$ and $^{13}C$ NMR were consistent with the structure. The product obtained was used as such in subsequent step.

The GC analysis was carried out as follows: Column: DB-5MS, 25 m, 0.32 mm id, 0.52 um film. Gradient: 75° C. to 300° C. @ 30° C./min, then hold 5 min @ 300° C. Injector: 275° C. Detector: 350° C. (FID); Retention time: 4.349 minutes.

Step 3—Endo/exo-NBCH$_2$C(O)C$_6$H$_4$OAc: A 12 L RBF was equipped with a thermowell, addition funnel, nitrogen inlet and mechanical stirrer. The RBF was charged with lithium bromide (LiBr) (237.7 g, 2.74 mol) in 700 mL of THF (drysolv) to give a clear solution. Then, 122.6 g of CuCN (1.37 mol) and 1.5 L of THF (drysolv) were added and the reaction mixture cooled to −20° C. with stirring. The addition funnel was charged with exo-/endo-NBCH2ZnBr (BASF, 1574.1 mL, 1.3 mol, 21 wt. % in THF) and added to the CuCN/LiBr solution slowly at −20° C. to −40° C. over 45 minutes. A dark greenish brown solution resulted and the reaction mixture warmed to 0° C. over 2 h. The reaction mixture was again cooled to −25° C. and the 4-acetoxy benzoyl chloride (236.4 g, 1.19 mol) was added neat via cannula and rinsed in with 200 mL of THF over 20 minutes at −25° C. to −5° C. giving a greenish brown slurry. Then, the reaction mixture warmed to room temperature slowly and stirred at room temperature for 2 h. An aliquot was quenched with (9:1) saturated $NH_4Cl$: $NH_4OH$ (conc.) and extracted with MTBE. LCMS analysis indicated 87.6% product with 4.6% norbornane byproduct and the reaction was complete. The reaction was quenched with 4L (9:1) saturated $NH_4Cl$:$NH_4OH$ (conc.) and diluted with 6L MTBE and gray precipitate was observed. The precipitate was filtered, the phases were separated and the aqueous phase extracted with (2×2 L) MTBE. The combined organic layers were washed with (2×2 L) saturated $NH_4Cl$:$NH_4OH$ (conc.) (9:1) followed by (3×2 L) brine and dried over sodium sulfate, filtered, and rotary evaporated, and further dried under high vacuum at 65° C. bath temperature to give 264.3 g crude product as a light yellow paste.

The 264.3 g crude product was dissolved in 500 mL $CH_2Cl2$ and adsorbed onto 265 g of silica gel. The $CH_2Cl2$ was removed under high vacuum and the crude product was chromatographed over 2.5 kg of silica gel eluting with heptane (20 L), 1% EtOAc in heptane (20 L), 2% EtOAc in heptane (20 L), 3% EtOAc in pentane (5 L), 4% EtOAc in pentane (8 L), 5% EtOAc in pentane (8 L), 6% EtOAc in pentane (4 L), 7% EtOAc in pentane (8 L), 8% EtOAc in pentane (8 L), 9% EtOAc in heptane (8 L), 10% EtOAc in heptane (4 L). The concentrated purified fractions yielded 213.8 g (66.4%) of product as clear viscous oil with 98.08% purity by GC. NMR and MS were consistent with the structure.

The GC analysis was carried out as follows: Column: DB-5MS, 25 m, 0.32 mm id, 0.52 um film. Gradient: 75° C.

to 300° C. @ 30° C./min, then hold 5 min @ 300° C. Injector: 275° C. Detector: 350° C. (FID); Retention time: 7.243 minutes.

Polymer Examples

The following Example 2 illustrates the preparation of polymers of this invention. Various other polymers within the scope of this invention can similarly be prepared using the appropriate starting materials.

Example 2

NBCH$_2$C(O)PhOAc homopolymer

A 250 mL 3-neck flask was fitted with a magnetic stir bar, a nitrogen gas inlet and a reflux condenser and charged with toluene (127.5 g), ethyl acetate (14.2 g), and endo,exo-1-[4-(acetyloxy)phenyl]-2-bicyclo[2.2.1]hept-5-en-2-yl ethanone from Example 1 (25 g, 0.092 mol). The RBF was sealed and the monomer solution was sparged with N2 for 20 minutes. The reaction solution was heated to 40° C. in an oil bath before addition of the catalyst. Under an inert atmosphere a solution of the nickel catalyst was prepared by dissolving bis-(pentafluorophenyl) nickel (0.55 g, 0.0011 mol) in ethyl acetate (15.7 g). The catalyst was mixed at ambient temperature until homogeneous, taken up in a 25M1 Syringe and injected into the reaction flask. The reaction mixture was stirred at 40° C. for 16 hours. A solution of 30 weight % hydrogen peroxide (5.5 g) and glacial acetic acid (6 g) was added to the reaction vessel and the resulting two phase solution was stirred for a further 2 hours. The reaction mixture was transferred into a 500 mL separatory funnel and ethyl acetate (50 mL), anisole (20 mL) and 2-methyl THF (100 mL) were added. The two phase system was vigorously mixed for 2 minutes and allowed to separate into two phases. The aqueous phase was decanted and the organic phase was washed with deionized water (3×100 mL). An aqueous solution of 10M NaOH (30 mL) and methanol (30 mL) were added to the vessel and the solution was agitated vigorously for 10 minutes. The solution was allowed to separate into two layers and the aqueous layer was removed. The organic phase was washed with deionized water (3×100 mL). The organic phase was acidified with concentrated HCl (30 mL) and washed repetitively with 1000 mL aliquots of deionized water until the solution pH was >6.5 by pH paper measurement. The solid polymer was isolated by precipitation of the organic phase into excess heptanes (500 mL), isolated by filtration and dried under vacuum at 50° C. for 18 hours; dry, off-white solid 23 g (92% yield). Molecular weight by GPC $M_n$=17,385; $M_w$=27,734; PDI 1.6.

The following Examples 3 to 6 illustrate the preparation of a few of the copolymers of this invention. Various other polymers within the scope of this invention can similarly be prepared using the appropriate starting materials.

Examples 3-6

Copolymers of NBCH$_2$C(O)PhOH/HFANB

The procedures of Example 2 were substantially repeated in Examples 3 to 7 except for using a combination of NBCH$_2$C(O)PhOAc and HFANB monomers in various different ratios to form the respective copolymers. The copolymer so formed in each Examples 3 to 7 was hydrolyzed to the respective NBCH$_2$C(O)PhOH using methanolic sodium hydroxide solution. The resulting copolymer in each case was characterized by GPC, and the mole ratios of the monomeric repeat units in the copolymer was analyzed by $^1$H NMR. Various feed ratios of the monomers used in Examples 3 to 6, $^1$H NMR and GPC results, and the yield of polymer are summarized in Table 1. Each of the polymer formed in Examples 3 to 6 was soluble in 0.26N TMAH solution.

TABLE 1

| Example No. | Composition NBCH$_2$C(O)PhOH/HFANB | | Molecular Weight | | | % |
|---|---|---|---|---|---|---|
| | Feed | $^1$H NMR | $M_n$ | $M_w$ | PDI | Yield |
| 3 | 90 10 | 91 9 | 14,839 | 27,701 | 1.93 | 89.7 |
| 4 | 75 25 | 76 24 | 15,476 | 27,499 | 1.78 | 83.6 |
| 5 | 50 50 | 48 52 | 18,577 | 28,673 | 1.54 | 81.4 |
| 6 | 25 75 | 24 76 | 19,310 | 29,670 | 1.54 | 83.6 |

The following Examples 7 to 9 illustrate the preparation of a terpolymer of this invention which is totally free of any fluorine containing monomers. Various other terpolymers (or other copolymers) can similarly be prepared employing the respective monomers which are within the scope of this invention.

Examples 7-9

Terpolymers of NBCH$_2$C(O)PhOH, NBCH$_2$CH$_2$CO$_2$H and NBTON

The procedures of Example 2 were substantially repeated in Examples 7 to 9 except that a terpolymer was made in these Examples 7 to 9 by using a combination of NBCH$_2$C(O)PhOAc, NBCH$_2$CH$_2$CO$_2$H and NBTON monomers in various different ratios to form the respective terpolymers. The terpolymer so formed in each case was hydrolyzed to the respective NBCH$_2$C(O)PhOH using methanolic sodium hydroxide solution. The resulting terpolymer in each case was characterized by GPC, and the mole ratios of the monomeric repeat units in the terpolymer was analyzed by $^1$H NMR. Various feed ratios of the monomers used in Examples 7 to 9, $^1$H NMR and GPC results, and the yield of polymer are summarized in Table 2. Each of the polymer formed in Examples 7 to 9 was soluble in 0.26N TMAH solution.

TABLE 2

| Example No. | Composition NBCH$_2$C(O)PhOH/NBCH$_2$CH$_2$CO$_2$H/NBTON | | | | | | Molecular Weight | | | % |
|---|---|---|---|---|---|---|---|---|---|---|
| | Feed | | | $^1$H NMR | | | $M_n$ | $M_w$ | PDI | Yield |
| 7 | 52.5 | 17.5 | 30 | 51 | 16 | 33 | 31,572 | 59,118 | 1.9 | 87.2 |
| 8 | 45 | 15 | 40 | 43 | 17 | 40 | 35,749 | 65,194 | 1.8 | 82.3 |
| 9 | 40 | 15 | 45 | 39 | 17 | 44 | 18,970 | 32,517 | 1.7 | 80.1 |

Comparative Example 1

Copolymer of NBPhOH and HFANB

The procedures of Example 2 were substantially repeated in this Comparative Example 1 except for using a combination of NBPhOAc and HFANB monomers at a molar ratio of 25:75 to form the respective copolymer. The copolymer so formed was hydrolyzed to NBPhOH using methanolic sodium hydroxide solution. The resulting copolymer was characterized by GPC, and the mole ratios of the monomeric repeat units in the copolymer was analyzed by $^1$H NMR and was found to be NBPhOH/HFANB=22:78. The GPC results were: $M_n$=24,381 and $M_w$=43,917; and PDI=1.8. Yield of the copolymer was 94%.

Comparative Example 2

Copolymer of NBPhOH and NBCH$_2$CH$_2$CO$_2$H

The procedures of Example 2 were substantially repeated in this Comparative Example 2 except for using a combination of NBPhOAc and NBCH$_2$CH$_2$CO$_2$H monomers at a molar ratio of 75:25 to form the respective copolymer. The copolymer so formed was hydrolyzed to NBPhOH using methanolic sodium hydroxide solution. The resulting copolymer was characterized by GPC, and the mole ratios of the monomeric repeat units in the copolymer was analyzed by $^1$H NMR and was found to be NBPhOH/NBCH$_2$CH$_2$CO$_2$H=73:27. The GPC results were: $M_n$=6,369 and $M_w$=33,546; and PDI=5.3. Yield of the copolymer was 81%.

Examples 10-14

Photosensitive Compositions of Polymers of Examples 2 to 6

The polymers of Example 2 to 6 were formulated into various photosensitive compositions/formulations of this invention as follows: A 40 weight % solution of polymer of Example 2 in ethyl lactate, and TrisP-3M6C-2-201, as needed were mixed in an appropriately sized amber HDPE bottle. The mixture was rolled for 18 hours to produce a homogeneous solution. Particle contamination was removed by filtering through a 1.0 μm pore nylon disc filter under 35 psi pressure. The filtered polymer formulation was collected in an amber, low particle HDPE bottle and stored at 5° C. Table 3 lists the polymer examples used in forming the photosensitive compositions of Examples 10-14.

TABLE 3

| Example No. | Polymer Example |
| --- | --- |
| 10 | 2 |
| 11 | 3 |
| 12 | 4 |
| 13 | 5 |
| 14 | 6 |

Examples 15-21

Photosensitive Compositions of terpolymers of Examples 7-9

The terpolymers of Examples 7 to 9 (NBCH$_2$C(O)PhOH/ NBCH$_2$CH$_2$COOH/NBTON) were formulated into various photosensitive compositions/formulations of this invention as follows: A 40 weight % solution of terpolymers of Examples 7 to 9 in ethyl lactate, TrisP-3M6C-2(5)-201, TrisP-3M6C-2(4)-201, Denacol EX321L, PEODGE, Heloxy 84, Si-75, Naugard 445, and KBM-403E as needed were mixed in an appropriately sized amber HDPE bottle. The mixture was rolled for 18 hours to produce a homogeneous solution. Particle contamination was removed by filtering through a 1.0 μm pore nylon disc filter under 35 psi pressure. The filtered polymer formulation was collected in an amber, low particle HDPE bottle and stored at 5° C. Table 4 lists various ingredients used in forming the photosensitive compositions of Examples 15-21.

TABLE 4

| Ingredients<br>Polymer | Ex. 15<br>Ex. 8 | Ex. 16<br>Ex. 8 | Ex. 17<br>Ex. 8 | Ex. 18<br>Ex. 8 | Ex. 19<br>Ex. 8 | Ex. 20<br>Ex. 7 | Ex. 21<br>Ex. 9 |
| --- | --- | --- | --- | --- | --- | --- | --- |
| Target T.S. (%) | 30 | 30 | 30 | 30 | 30 | 30 | 30 |
| TrisP-3M6C-2(5)-201 | 25 |  | 25 | 25 | 25 | 25 | 25 |
| TrisP-3M6C-2(4)-201 |  | 25 |  |  |  |  |  |
| Denacol EX321L |  |  | 20 |  |  | 20 | 20 |
| PEODGE |  |  |  | 20 |  |  |  |
| Heloxy 84 |  |  |  |  | 20 |  |  |
| Si-75 |  |  | 3 | 3 | 3 | 3 | 3 |
| Naugard 445 |  |  | 5 | 5 | 5 | 5 | 5 |
| KBM-403E |  |  | 5 | 5 | 5 | 5 | 5 |

Comparative Examples 3 and 4

Photosensitive compositions of Comparative Examples 1 and 2

The copolymer of Comparative Example 1 (NBPhOH/HFANB) and the copolymer of Comparative Example 2 (NBPhOH/NBCH$_2$CH$_2$CO$_2$H) were formulated into various photosensitive compositions/formulations substantially in the same fashion as follows: A 40 weight % solution of each of polymer of Comparative Examples 1 and 2 in ethyl lactate, and TrisP-3M6C-2-201, as needed were mixed in an appropriately sized amber HDPE to bottle. The mixture was rolled for 18 hours to produce a homogeneous solution. Particle contamination was removed by filtering through a 1.0 µm pore nylon disc filter under 35 psi pressure. The filtered polymer formulation was collected in an amber, low particle HDPE bottle and stored at 5° C.

Example 22

Spin Coating Procedures

The photosensitive compositions made in accordance with procedures as set forth in Examples 10 to 21 and Comparative Examples 3 and 4 were spin coated onto a suitable substrate using one of the following spin protocols: The compositions of Examples 10 to 21 and Comparative Examples 3 and 4 were bought to ambient temperature before use. The photosensitive compositions of Examples 10 to 21 and Comparative Examples 3 and 4 were applied to a 125 mm diameter silicon wafer (wafer thickness: 725 µm) by spin coating at 500 rpm of 10 seconds and then at 1200 rpm for 30 seconds on a CEE-200 CB spin coater (Brewer Scientific). The substrate was then placed on a 100° C. hot plate for 2 minutes to remove residual solvent (post apply bake, PAB), providing a film with a thickness of 11.1 µm. Film thickness before exposure were measured by contact profilometry using a DekTak 150 stylus profilometer.

Example 23

Exposure and Aqueous Base development

An AB-M contact mask aligner fitted with an 1 line (365 nm) band pass filter was used to imagewise expose the polymer film through a masking element using a range of exposure energies from 0-976 mJ/cm$^2$. The latent image was developed with 0.26 N TMAH solution (CD-26) using a puddle development method consisting of a 5 second spray and 70 second puddle immersion cycle. The wafer and patterned film was rinsed by spraying deionized water for 5 seconds to remove residual developer solvent and then dried by spinning at 3000 rpm for 15 seconds. The film was then evaluated with an Optiphot-88 microscope [Nikon] to determine the threshold energy (Eth) required to open a residue free, 10 µm isolated trench opening.

FIGS. 1A to 1E is a representative example of an image of the line and space pattern obtained from the photosensitive compositions of Examples 10 to 14 respectively. It is evident from FIGS. 1A to 1E excellent patterns with good resolution can be obtained by the photosensitive compositions of this invention. The monomer ratio in the copolymer also effects the quality of the films. As the HFANB monomer content increases in the copolymers of Examples 3 to 6 from 10 mole percent (Example 3) to 75 mole percent (Example 6) the films begin to crack when coated at 10 µm thickness.

It is further evident that the homopolymer, NBCH$_2$C(O)PhOH homopolymer, of Example 2 gives a more mechanically robust film as manifested by FIG. 1A.

Example 24

Dark Field Loss (DFL) Measurements

The film thickness after 0.26 N TMAH development and drying were measured using the Dektak 150. Dark field loss was then calculated as a % change in film thickness as follows:

$$\% DFL = \left[ \frac{\text{Thickness after } PAB - \text{Thickness after } 0.26N \ TMAH \ \text{develop}}{\text{Thickness after } PAB} \right] \times 100$$

Where PAB is post apply bake as set forth in Example 22. The results of these measurements are summarized in Table 5.

TABLE 5

| | Ex. 10 | Ex. 11 | Ex. 12 | Ex. 13 | Ex. 14 |
|---|---|---|---|---|---|
| Film thickness after PAB | 10.8 | 10.3 | 10.2 | 10.5 | 7.6 |
| 0.26N TMAH Develop time (sec) | 70 | 65 | 50 | 45 | 50 |
| Film thickness after develop | 10.3 | 9.7 | 9.2 | 9.9 | 7.1 |
| Dark field loss (%) | 5.2 | 5.8 | 9.8 | 3 | 5.9 |
| Eth (mJ/cm$^2$) | 732 | 650 | 650 | 732 | 500 |
| Resolution Line & Space pattern | 5 | 5 | 3 | 7 | 7 |

Comparative Examples 3 and 4 were similarly examined. A copolymer of Comparative Example 3 (NBPhOH and HFANB (25/75)) was coated onto a 100 mm SiO$_2$ wafer giving a film thickness of 8.2 µm after PAB. The film was imagewise exposed through a patterned mask and a gradient density filter with a maximum exposure energy dose of 1000 mJ/cm$^2$. Subsequent development of the latent image with 0.26N TMAH developer was performed for 300 seconds. At this time the latent image had not developed but cracking of the film was observed in several locations as shown in FIG. 2B.

Figure 2B:
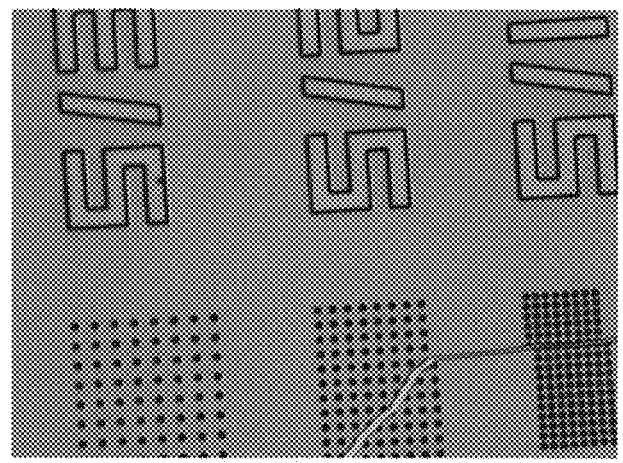
Figure 2A:
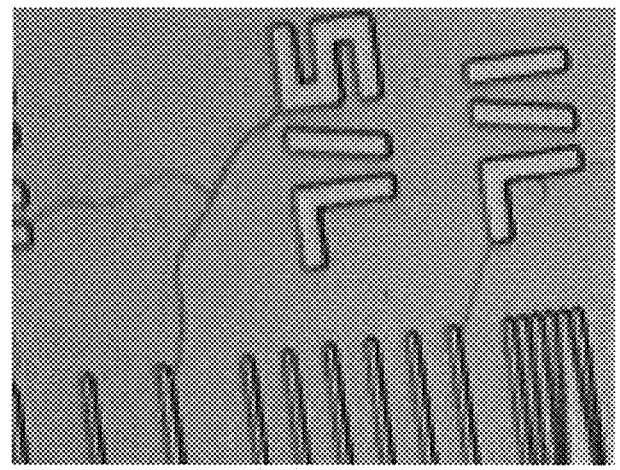
Figure 3E:
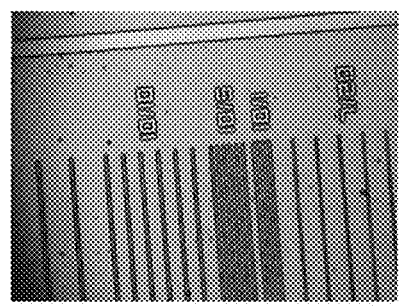
FIGS. 3A to 3E show optical micrographs of a positive tone lithographic images of line and space pattern obtained from a few of the photosensitive composition embodiments of this invention.
Figure 3D:
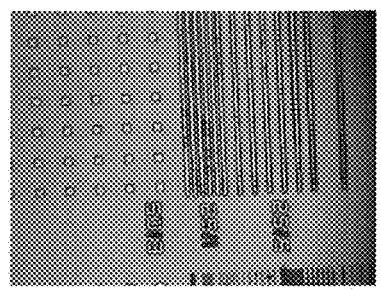
Figure 3C:
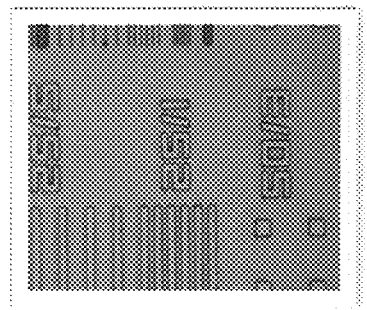
Figure 3B:
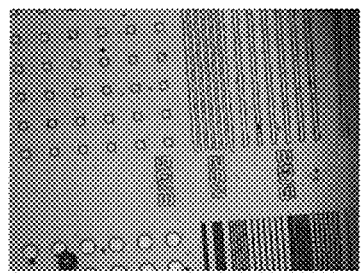
Figure 3A:
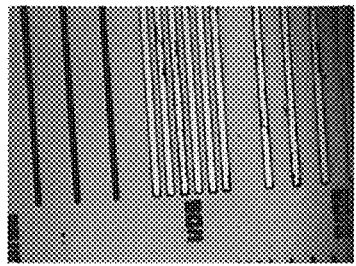

As noted, FIGS. 2B and 2C show respectively the optical micrographs of the line and space patterns obtained for these two compositions which are compared with the line and space pattern obtained for the composition of Example 14 (a copolymer of NBCH$_2$C(O)PhOH:HFANB of 25:75 mole ratio). FIG. 2A is clearly a better patterned photograph at only 50 seconds develop time at Eth of 732 mJ/cm$^2$, whereas FIG. 2B required greater than 300 seconds develop time and also required Eth of 1000 mJ/cm$^2$ and FIG. 2C required 30 seconds develop time and Eth of 488 mJ/cm$^2$ This clearly illustrates the improvement imparted by the presence of the carbonyl —C(O)— functional group in the monomeric repeat units of this invention.

The results obtained for Comparative Examples 3 and 4 are summarized in Table 6.

TABLE 6

|  | Comp. Ex. 3 | Comp. Ex. 4 |
|---|---|---|
| Film thickness after PAB | 8.2 | 9.7 |
| 0.26N TMAH Develop time (sec) | >300 | 30 |
| Film thickness after develop | 9.1 | 8.6 |
| Dark field loss (%) | 0 | 12 |
| Eth (mJ/cm$^2$) | >1000 | 488 |
| Resolution Line & Space pattern | 5 | 7 |

Finally, the compositions of Examples 15 to 21 were similarly examined and the results are summarized in Table 7.

TABLE 7

| Example No. | Film Thickness pre-develop | Develop Time (Seconds) | Dark Field Loss percentage (%) | Photospeed (mJ/cm$^2$) | Line and Space resolution (μm) |
|---|---|---|---|---|---|
| 15 | 11.0 μm | 15 | 4 | 608 | 50 |
| 16 | 10.2 μm | 20 | 2 | 608 | 25 |
| 17 | 9.8 μm | 8 | 16.8 | 824 | 50 |
| 18 | 9.5 μm | 10 | 2.5 | 710 | 25 |
| 19 | 11.9 μm | 10 | 11.5 | 405 | 7 |
| 20 | 9.6 μm | 7 | 21.3 | 608 | 10 |
| 21 | 10.3 μm | >60 | 4.6 | — | — |

Figure 4C:
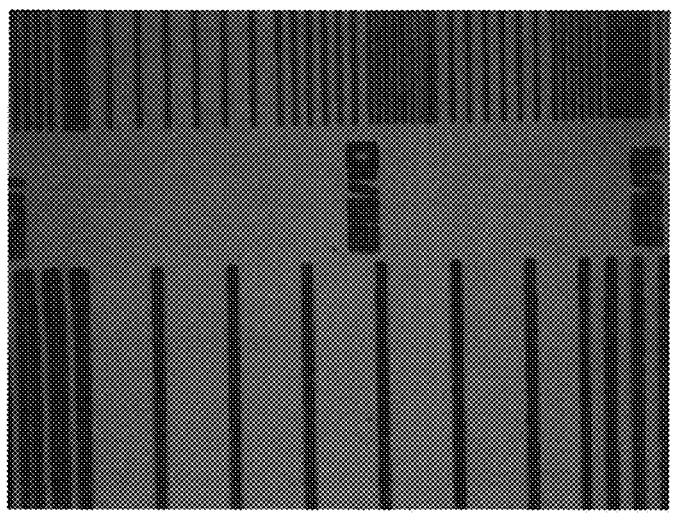
FIGS. 4A to 4C show optical micrographs of a positive tone lithographic images of line and space pattern obtained from a few of the photosensitive composition embodiments of this invention.
Figure 4B:
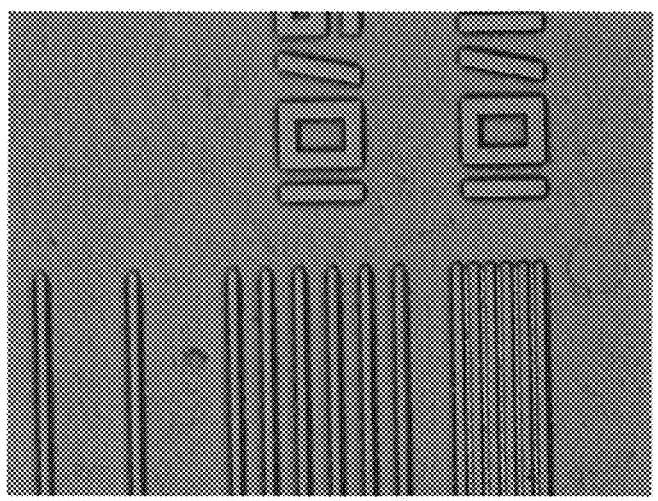
Figure 4A:
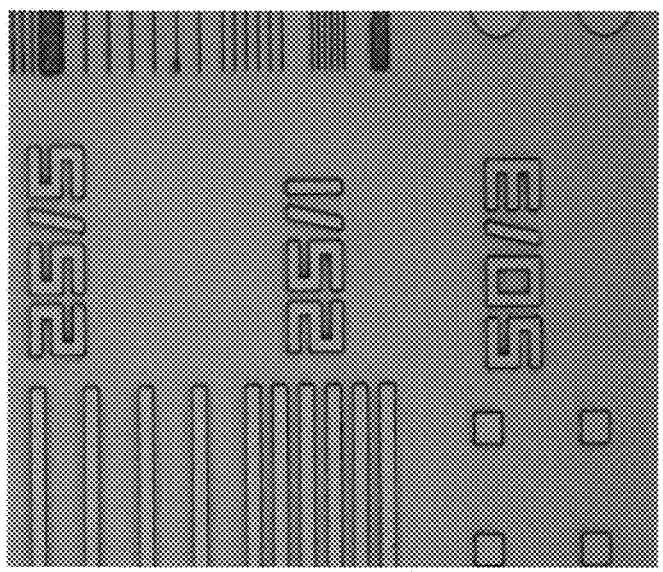

FIGS. 3A to 3E show the optical micrographs of the line and space patterns obtained for the compositions of Examples 15 to 19 respectively. FIGS. 4B and 4C show the optical micrographs of the line and space patterns obtained for the compositions of Examples 20 and 21, which are compared with the line and space pattern obtained for the composition of Example 17, FIG. 4A.

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:

1. A polymer selected from the group consisting of:
   a terpolymer of 2-(bicyclo[2.2.1]hept-5en-2-yl)-1-(4-hydroxyphenyl)ethan-1-one, 2-(bicyclo[2.2.1]hept-5-en-2-ylmethyl)-1,1,1,3,3,3-hexafluoropropan-2-ol and 2-(bicyclo[2.2.1]hept-5-en-2-yl)acetic acid;
   a terpolymer of 2-(bicyclo[2.2.1]hept-5-en-2-yl)-1-(4-hydroxyphenyl)ethan-1-one, 4-(bicyclo[2.2.1]hept-5-en-2-yl)-1,1,1-trifluoro-2-(trifluoromethyl)butan-2-ol and 2-(bicyclo[2.2.1]hept-5-en-2-yl)acetic acid;
   a terpolymer of 2-(bicyclo[2.2.1]hept-5-en-2-yl)-1-(4-hydroxyphenyl)ethan-1-one, 5-(bicyclo[2.2.1]hept-5-en-2-yl)-1,1,1-trifluoro-2-(trifluoromethyl)pentan-2-ol and 2-(bicyclo[2.2.1]hept-5-en-2-yl)acetic acid;
   a terpolymer of 2-(bicyclo[2.2.1]hept-5-en-2-yl)-1-(4-hydroxyphenyl)ethan-1-one, 2-(bicyclo[2.2.1]hept-5-en-2-ylmethyl)-1,1,1,3,3,3 -hexafluoropropan-2-ol and 3-(bicyclo[2.2.1]hept-5-en-2-yl)propanoic acid;
   a terpolymer of 3-(bicyclo[2.2.1]hept-5-en-2-yl)-1-(4-hydroxyphenyl)propan-1-one, 3-(bicyclo[2.2.1]hept-5-en-2-yl)propanoic acid and 2-(bicyclo[2.2.1]hept-5-en-2-ylmethyl)-1,1,1,3,3,3-hexafluoropropan-2-ol;
   a terpolymer of 3-(bicyclo[2.2.1]hept-5-en-2-yl)-1-(4-hydroxyphenyl)propan-1-one, 3-(bicyclo[2.2.1]hept-5-en-2-yl)propanoic acid and 4-(bicyclo[2.2.1]hept-5-en-2-yl)-1,1,1-trifluoro-2-(trifluoromethyl)butan-2-ol;
   a terpolymer of 3-(bicyclo[2.2.1]hept-5-en-2-yl)-1-(4-hydroxyphenyl)propan-1-one, 3-(bicyclo[2.2.1]hept-5-en-2-yl)propanoic acid and 5-(bicyclo[2.2.1]hept-5-en-2-yl)-1,1,1-trifluoro-2-(trifluoromethyl)pentan-2-ol; and
   a terpolymer of 2-(bicyclo[2.2.1]hept-5-en-2-yl)-1-(4-hydroxyphenyl)ethan-1-one, 3-(bicyclo[2.2.1]hept-5-en-2-yl)propanoic acid and 5-((2-(2-methoxyethoxy)ethoxy)methyl)-bicyclo[2.2.1]hept-2-ene.

2. The polymer according to claim 1, which is selected from the group consisting of:
   a terpolymer of 2-(bicyclo[2.2.1]hept-5-en-2-yl)-1-(4-hydroxyphenyl)ethan-1-one, 2-(bicyclo[2.2.1]hept-5-en-2-ylmethyl)-1,1,1,3,3,3-hexafluoropropan-2-ol and 3-(bicyclo[2.2.1]hept-5-en-2-yl)propanoic acid; and
   a terpolymer of 2-(bicyclo[2.2.1]hept-5-en-2-yl)-1-(4-hydroxyphenyl)ethan-1-one, 3-(bicyclo[2.2.1]hept-5-en-2-yl)propanoic acid and 5-((2-(2-methoxyethoxy)ethoxy)methyl)-bicyclo[2.2.1]hept-2-ene.

3. A layer forming polymer composition comprising:
   a polymer selected from the group consisting of:
   a terpolymer of 2-(bicyclo[2.2.1]hept-5-en-2-yl)-1-(4-hydroxyphenyl)ethan-1-one, 2-(bicyclo[2.2.1]hept-5-en-2-ylmethyl)-1,1,1,3,3,3-hexafluoropropan-2-ol and 2-(bicyclo[2.2.1]hept-5-en-2-yl)acetic acid;
   a terpolymer of 2-(bicyclo[2.2.1]hept-5-en-2-yl)-1-(4-hydroxyphenyl)ethan-1-one, 4-(bicyclo[2.2.1]hept-5-en-2-yl)-1,1,1-trifluoro-2-(trifluoromethyl)butan-2-ol and 2-bicyclo[2.2.1]hept-5-en-2-yl)acetic acid;
   a terpolymer of 2-(bicyclo[2.2.1]hept-5-en-2-yl)-1-(4-hydroxyphenyl)ethan-1-one, 5-(bicyclo[2.2.1]hept-5-en-2-yl)-1,1,1,-trifluoro-2-(trifluoromethyl)pentan-2-ol and 2-(bicyclo[2.2.1]hept-5-en-2-yl)acetic acid;
   a terpolymer of 2-(bicyclo[2.2.1]hept-5-en-2-yl)-1-(4-hydroxyphenyl)ethan-1-one, 2-(bicyclo[2.2.1]hept-5-en-2-ylmethyl)-1,1,1,3,3,3-hexafluoropropan-2-ol and 3-(bicyclo[2.2.1]hept-5-en-2-propanoic acid;
   a terpolymer of 3-(bicyclo[2.2.1]hept-5-en-2-yl)-1-(4-hydroxyphenyl)propan-1-one, 3-(bicyclo[2.2.1]hept-5-en-2-yl)propanoic acid and 2-(bicyclo[2.2.1]hept-5-en-2-ylmethyl)-1,1,1,3,3,3-hexafluoropropan-2-ol;
   a terpolymer of 3-(bicyclo[2.2.1]hept-5-en-2-yl)-1-(4-hydroxyphenyl propan-1-one, 3-(bicyclo[2.2.1]hept-5-en-2-yl)Propanoic acid and 4-(bicyclo[2.2.1]hept-5-en-2-yl)-1,1,1-trifluoro-2-(trifluoromethyl)butan-2-ol;
   a terpolymer of 3-(bicyclo[2.2.1]hept-5-en-2-yl)-1-(4-hydroxyphenyl)propan-1-one, 3-(bicyclo[2.2.1]hept-5-en-2-yl)Propanoic acid and 5-(bicyclo[2.2.1]hept-5-en-2-yl)-1,1,1-trifluoro-2-(trifluoromethyl)pentan-2-ol; and
   a terpolymer of 2-(bicyclo[2.2.1]hept-5-en-2-yl)-(4-hydroxyphenyl)ethan-1-one, 3-(bicyclo[2.2.1]hept-5-en-2-yl)propanoic acid and 5-((2-(2-methoxyethoxy)ethoxy)methyl)-bicyclo[2.2.1]hept-2-ene;
   a photo active compound;
   an epoxy resin; and
   a solvent.

4. The composition according to claim 3, wherein said photoactive compound comprises a 1,2-naphthoquinonediazide-5-sulfonyl moiety and/or a 1,2-naphthoquinonediazide-4-sulfonyl moiety as represented by structural formulae (IIIa) and (IIIb), respectively:

(IIIa)

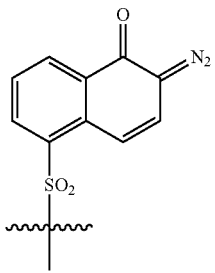

(IIIb)

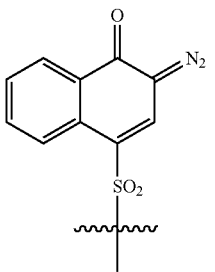

or a sulfonyl benzoquinone diazide group represented by structural formula (IIIc):

(IIIc)

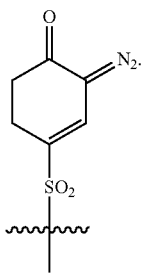

5. The composition according to claim 4, wherein said photoactive compound is

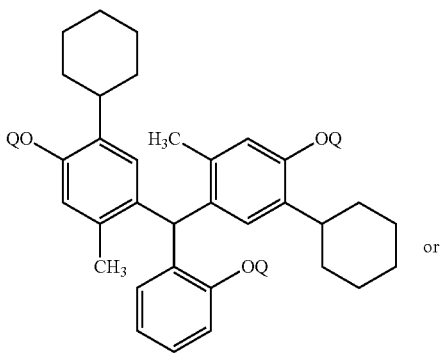

or

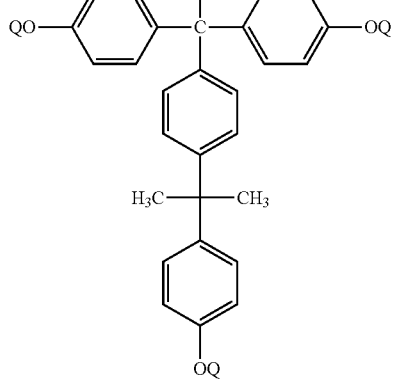

wherein at least one of Q is a group of formula (VIIa) or (VIIb):

(VIIa)

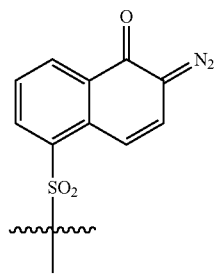

(VIIb)

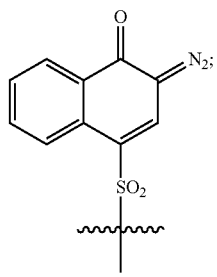

and the remaining Q is hydrogen.

6. The composition according to claim 3, wherein said epoxy resin is selected from the group consisting of:
bisphenol A epoxy resin;
polypropylene glycol epoxy resin;
bis(4-(oxiran-2-ylmethoxy)phenyl)methane;
glycidyl ether of para-tertiary butyl phenol;
polyethylene glycol diglycidyl ether;
polypropylene glycol diglycidyl ether;
and a mixture in any combination thereof.

7. The composition according to claim 3, wherein said solvent is propyleneglycol monomethylether acetate, gamma-butyrolactone or N-methylpyrrolidone.

8. The composition according to claim 3, wherein said composition further comprises one or more additives selected from the group consisting of:
adhesion promoters;
antioxidants;
surfactants;
thermal acid generator;
thermal base generator; and
mixtures in any combination thereof.

9. A process for forming a cured product, comprising: (i) applying the layer forming polymer composition of claim 3 on a substrate to form a coating film, (ii) exposing the coating film to light through a desired pattern mask, (iii) dissolving and removing the exposed portions by developing with an alkaline developer to obtain the desired pattern, and (iv) heating the obtained desired pattern.

10. A cured product obtained by curing the layer forming polymer composition of claim 3.

11. An optoelectronic or microelectronic device comprising the cured product of claim 10, which is having a dielectric constant of 3.2 or less at 1 MHz.

* * * * *